(12) United States Patent
Cheng et al.

(10) Patent No.: US 11,817,469 B2
(45) Date of Patent: Nov. 14, 2023

(54) LIGHT ABSORBING LAYER TO ENHANCE P-TYPE DIFFUSION FOR DTI IN IMAGE SENSORS

(71) Applicant: Taiwan Semiconductor Manufacturing Co., Ltd., Hsinchu (TW)

(72) Inventors: Yu-Hung Cheng, Tainan (TW); Ching I Li, Tainan (TW); Yu-Siang Fang, Tainan (TW); Yu-Yao Hsia, Tainan (TW); Min-Ying Tsai, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 5 days.

(21) Appl. No.: 17/397,132

(22) Filed: Aug. 9, 2021

(65) Prior Publication Data
US 2022/0367535 A1    Nov. 17, 2022

Related U.S. Application Data

(60) Provisional application No. 63/188,251, filed on May 13, 2021.

(51) Int. Cl.
*H01L 27/14* (2006.01)
*H01L 27/146* (2006.01)
*H01L 21/762* (2006.01)

(52) U.S. Cl.
CPC .... *H01L 27/1463* (2013.01); *H01L 21/76224* (2013.01); *H01L 27/14683* (2013.01)

(58) Field of Classification Search
None
See application file for complete search history.

(56) References Cited

U.S. PATENT DOCUMENTS

| 10,147,756 B2 * | 12/2018 | Cheng | H05K 999/99 |
| 2007/0041801 A1 * | 2/2007 | Randecker | B23P 15/28 408/229 |

(Continued)

OTHER PUBLICATIONS

Abbadie et al. "An efficient wet-cleaning of SiGe virtual substrates and of thick, pure Ge layers on Si(001) after a chemical mechanical planarization step" Microelectronic Engineering 83 (2006) 1986-1993, published on Mar. 30, 2006.

(Continued)

*Primary Examiner* — Ali Naraghi
(74) *Attorney, Agent, or Firm* — Eschweiler & Potashnik, LLC

(57) ABSTRACT

In some embodiments, the present disclosure relates to a method for forming an integrated chip (IC), including forming a plurality of image sensing elements including a first doping type within a substrate, performing a first removal process to form deep trenches within the substrate, the deep trenches separating the plurality of image sensing elements from one another, performing an epitaxial growth process to form an isolation epitaxial precursor including a first material within the deep trenches and to form a light absorbing layer including a second material different than the first material within the deep trenches and between sidewalls of the isolation epitaxial precursor, performing a dopant activation process on the light absorbing layer and the isolation epitaxial precursor to form a doped isolation layer including a second doping type opposite the first doping type, and filling remaining portions of the deep trenches with an isolation filler structure.

20 Claims, 37 Drawing Sheets

(56) References Cited

U.S. PATENT DOCUMENTS

| | | | |
|---|---|---|---|
| 2016/0284746 A1* | 9/2016 | Fukase | H01L 27/14689 |
| 2019/0096929 A1* | 3/2019 | Chiang | H01L 27/14612 |
| 2019/0140006 A1 | 5/2019 | Cheng et al. | |
| 2019/0157322 A1* | 5/2019 | Li | H01L 27/14685 |
| 2020/0066768 A1* | 2/2020 | Cheng | H01L 27/1464 |

OTHER PUBLICATIONS

Singh et al. "Analysis of Si/SiGe Heterostructure Solar Cell" Journal of Energy, vol. 2014, Article ID 946406, 7 pages, published on Jul. 23, 2014.

Zangenberg et al. "Boron and phosphorus diffusion in strained and relaxed Si and SiGe" Journal of Applied Physics 94, 3883 (2003), published on Aug. 29, 2003.

Shibahara et al. "Green Laser Annealing With Light Absorber" 13th IEEE International Conference on Advanced Thermal Processing of Semiconductors—RTP 2005, published on Apr. 10, 2006.

Kadhim et al. "Optical Constants of Fe2O3 and TiO2:Fe2O3 Thin Films Prepared by Spray Pyrolysis Technique" Journal of University of Babylon for Pure and Applied Sciences, vol. (26), No. (10): 2018, published on Dec. 5, 2018.

De Rosa et al. "Silicon Photo Multipliers Detectors Operating in Geiger Regime: an Unlimited Device for Future Applications" Photodiodes—World Activities in 2011, published Jul. 2011.

Oleiwi et al. "Structural and optical properties of Al2O3 nanocrystalline: Effect of deposition time" AIP Conference Proceedings 2144, 030027 (2019), published on Aug. 23, 2019.

* cited by examiner

US 11,817,469 B2

LIGHT ABSORBING LAYER TO ENHANCE P-TYPE DIFFUSION FOR DTI IN IMAGE SENSORS

PRIORITY CLAIM AND CROSS-REFERENCE

This application claims priority to U.S. Provisional Application No. 63/188,251 filed on May 13, 2021, entitled "DSA LIGHT ABSORBER TO ENHANCE P-TYPE DIFFUSION FOR BDTI IN IMAGE SENSORS", which application is hereby incorporated herein by reference.

BACKGROUND

Many modern day electronic devices, such as digital cameras and video cameras, contain image sensors to convert optical images to digital data. To achieve this, an image sensor comprises an array of pixel regions. Each pixel region contains a photodiode configured to capture optical signals (e.g., light) and convert it to digital data (e.g., a digital image). Complementary metal-oxide-semiconductor (CMOS) image sensors are often used over charge-coupled device (CCD) image sensors because of their many advantages, such as lower power consumption, faster data processing, and lower manufacturing costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
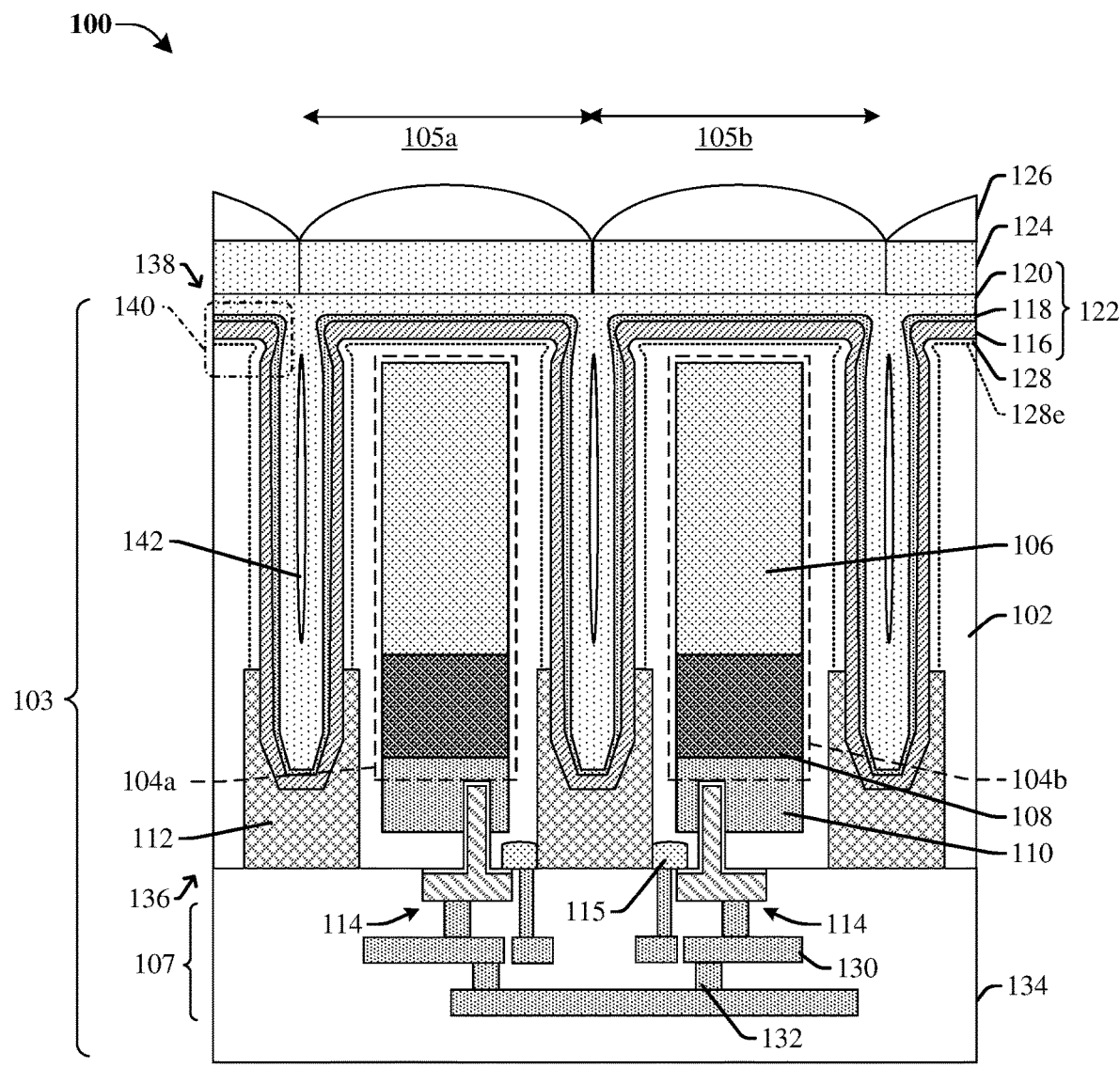
FIG. 1 illustrates a cross-sectional view of some embodiments of an integrated chip (IC) comprising a substrate having a dopant diffusion region extending from a deep trench isolation (DTI) structure into the substrate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A complementary metal-oxide-semiconductor (CMOS) image sensor (CIS) device may include a plurality of pixel regions arranged on or within a substrate. Each pixel region comprises an image sensing element, such as a photodiode, that is configured to receive incident light comprising photons. The pixel regions may be separated from one another by a deep trench isolation (DTI) structure to improve the quantum efficiency of the CIS. To accommodate shrinkage of CIS devices while at least maintaining an amount of charge that can be stored in an individual pixel region without the pixel region becoming saturated (e.g., full well capacity), the DTI comprises a doped isolation layer.

In fabrication, the doped isolation layer undergoes a dopant activation process (e.g., dynamic surface anneal) to diffuse dopants into the substrate. However, the high temperatures of the dopant activation process may induce imperfections such as, for example, dislocations, cracks, a change in a cross-sectional profile of the DTI, and/or surface peeling. These imperfections can lead to performance issues for the CIS device. To avoid this, the dopant activation process may be performed at a lower temperature. However, in doing so, dopants are only slightly diffused into the substrate, which may decrease the full well capacity. Further, too small of a diffusion distance may adversely affect the number of white pixels and/or the dark current of the device, leading to performance issues.

In view of the above, various embodiments of the present disclosure relate to a method for forming a CIS device comprising a DTI structure and a doped isolation layer for avoiding imperfections and at least maintaining the full well capacity. In some embodiments, a plurality of image sensing elements having a first doping type (e.g., n-type) is formed into a substrate, and deep trenches are etched into the substrate to separate the plurality of image sensing elements from one another. An epitaxial growth process forms a doped isolation layer having a second doping type opposite the first (e.g., p-type) into the deep trenches and between sidewalls of the substrate. A light absorbing layer is formed into the deep trenches and between sidewalls of the doped isolation layer. A dopant activation process is then performed on the light absorbing layer.

The light absorbing layer absorbs light from the dopant activation process and correspondingly heats up. In doing so, the light absorbing layer prevents the induction of imperfections in the CIS device at high annealing temperatures. Further, by heating up, the light absorbing layer provides tensile stress to the doped isolation layer, which promotes diffusion of dopants from the doped isolation layer into the substrate. Hence, dopants are diffused into the substrate a sufficient distance so as to improve full well capacity, the number of white pixels, and/or the dark current without impairing device performance.

FIG. 1 illustrates a cross-sectional view 100 of some embodiments of an integrated chip (IC) comprising a substrate 102 having a dopant diffusion region 128 extending from a DTI structure 122 into the substrate 102. An image sensing die 103 comprises the substrate 102 and the DTI structure 122. The substrate 102 has a frontside 136 and a backside 138. The DTI structure 122 comprises a plurality of deep trenches extending into the backside 138 of the substrate 102, defining the substrate 102 into a plurality of pixel regions that may be arranged in an array comprising rows and/or columns, such as pixel regions 105a, 105b shown in FIG. 1. In the pixel regions 105a, 105b, the respective image sensing elements 104a, 104b are configured to convert incident radiation (e.g., photons) into an electric signal. A deep well region 106, a deep photodiode region 108, and a pinned photodiode region 110 are disposed within the substrate 102 and between individual trenches of the DTI structure 122, and respectively define the image sensing elements 104a, 104b. In some embodiments, the deep well region 106, the deep photodiode region 108, and the pinned photodiode region 110 may have a first doping type (e.g., n-type). In some embodiments, the deep well region 106 may have a dopant concentration less than that of the deep photodiode region 108. In some embodiments, the deep photodiode region 108 may have a dopant concentration less than that of the pinned photodiode region 110.

An isolation well 112 is further disposed within the substrate 102 and between pixel regions 105a, 105b. The isolation well 112 extends from the frontside 136 of the substrate 102 to a position within the substrate 102. In some embodiments, the isolation well 112 may be vertically aligned with an individual trench of the DTI structure 122. In some embodiments, the isolation well 112 and the substrate 102 may have a second doping type (e.g., p-type) opposite the first doping type. In some embodiments, the substrate 102 may have a dopant concentration less than that of the isolation well 112. A floating diffusion well 115, which corresponds to a source/drain region next to a transfer gate 114, extends from the frontside 136 of the substrate 102 to a position within the substrate 102. Although the DTI structure 122 is illustrated in FIG. 1 as extending partially into the isolation well 112, it will be appreciated that in some alternative embodiments (not shown), the DTI structure 122 may alternatively extend to a location overlying the isolation well 112.

The transfer gate 114 is arranged along the frontside 136 of the substrate 102. The transfer gate 114 may include a protrusion that extends from the frontside 136 of the substrate 102 to a position within the pinned photodiode region 110. During operation, the transfer gate 114 controls charge transfer from the corresponding image sensing element 104a, 104b to the floating diffusion well 115. If the charge level is sufficiently high within the floating diffusion well 115, a source follower transistor (not shown) is activated and charges are selectively output according to operation of a row select transistor (not shown) used for addressing. A reset transistor (not shown) can be used to reset the image sensing element 104a, 104b between exposure periods. A metallization stack 107 comprising a plurality of metal lines 130 and a plurality of metal interconnect vias 132 is disposed within a first inter-dielectric layer (ILD) structure 134, and is electrically coupled to the transfer gate 114 and the diffusion well 115.

The DTI structure 122 comprises an isolation filler structure 120, a doped isolation layer 116, and a high-k dielectric layer 118. The doped isolation layer 116 lines a sidewall surface of a deep trench of the substrate 102, the high-k dielectric layer 118 lines a sidewall surface of the doped isolation layer 116, and the isolation filler structure 120 fills a remaining space of the deep trench between inner sidewalls of the high-k dielectric layer 118. In some embodiments, the isolation filler structure 120 comprises a void or air gap 142. In some of such embodiments, the isolation filler structure 120 and the void or air gap 142 entirely fill the remaining space of the deep trench. In some embodiments, the deep trench may refer to a trench that extends at least halfway into the substrate 102. The doped isolation layer 116 comprises the second doping type. In some embodiments, the doped isolation layer 116 is more heavily doped than the substrate 102. The doped isolation layer 116, the high-k dielectric layer 118, and the isolation filler structure 120 may extend laterally along the backside 138 of the substrate 102 overlying the image sensing elements 104a, 104b. In alternative embodiments, the DTI structure 122 is absent of a high-k dielectric layer, and the doped isolation layer 116 is in direct contact with the isolation filler structure 120.

The dopant diffusion region 128 is a portion of the substrate 102 that is more heavily doped with the second doping type as compared to the rest of the substrate 102. The dopant diffusion region 128 extends into the substrate 102 from the doped isolation layer 116 to an outer edge 128e, such that the dopant diffusion region 128 continuously extends along the backside 138 of the substrate 102 and along inner sidewalls of the substrate 102. The doped isolation layer 116, the dopant diffusion region 128, and the isolation well 112 collectively isolate the image sensing elements 104a, 104b from one another, and the dopant diffusion region 128 extends a sufficient distance into the substrate 102 so as to improve to improve full well capacity, the number of white pixels, and/or the dark current without impairing device performance. In some embodiments, the dopant diffusion region 128 may be approximately 10 to approximately 20 times more heavily doped than the substrate 102, approximately 15 to approximately 20 times more heavily doped than the substrate 102, or some other suitable value.

A plurality of color filters 124 is arranged over the substrate 102 and over the DTI structure 122. The plurality of color filters 124 are respectively configured to transmit specific wavelengths of incident radiation. For example, a first color filter (e.g., a red color filter) may transmit light having wavelengths within a first range, while a second color filter may transmit light having wavelengths within a second range different than the first range. A plurality of micro-lenses 126 is arranged over the plurality of color filters 124. Respective micro-lenses 126 are aligned laterally with the color filters 124 and overlie the pixel regions 105a, 105b. In some embodiments, the plurality of micro-lenses 126 have a substantially flat bottom surface abutting the plurality of color filters 124 and a curved upper surface. The curved upper surface is configured to focus the incident radiation (e.g., light towards the underlying pixel regions 105a, 105b). During operation, the incident radiation is focused by the micro-lenses 126 to the underlying pixel regions 105a, 105b. When incident radiation of sufficient energy strikes the image sensing elements 104a, 104b, it generates an electron-hole pair that produces a photocurrent. Notably, though the micro-lenses 126 are shown as fixing onto the IC in FIG. 1, it is appreciated that the IC may not include micro-lenses, and the micro-lenses may be attached to the IC later in a separate manufacture activity.

In some embodiments, the substrate 102 may be or comprise, for example crystalline silicon or some other suitable semiconductor material(s). In some embodiments, the doped isolation layer 116 may be or comprise, for example silicon or some other suitable semiconductor material(s). In some embodiments, the image sensing elements 104a, 104b may, for example, be or comprise a photodiode, an avalanche photodiode, a single-photon avalanche diode, some other suitable photodetector, or the like. In some embodiments, the isolation filler structure 120 comprises silicon dioxide, silicon nitride, or some other suitable dielectric material(s). In some embodiments, the high-k dielectric layer 118 may be or comprise, for example, aluminum oxide ($Al_2O_3$), hafnium oxide ($HfO_2$), hafnium silicon oxide (HfSiO), hafnium aluminum oxide (HfAlO), tantalum oxide ($Ta_2O_5$), or hafnium tantalum oxide (HMO), or some other suitable high-k dielectric material(s). In some embodiments, the first ILD structure 134 may be or comprise, for example, nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. The plurality of metal lines 130 and the plurality of metal interconnect vias 132 are or comprise, for example, copper, aluminum, some other suitable metal(s), or a combination of the foregoing. Although the IC illustrated in FIG. 1 is backside illuminated (BSI), it will be appreciated that in some alternative embodiments (not shown), the IC may alternatively be frontside illuminated (FSI).

During fabrication of the IC of FIG. 1, a light absorbing layer (not shown) is temporarily formed to absorb light during a dopant activation process and heats up, and may be removed before the high-k dielectric layer 118. In doing so, the light absorbing layer prevents the induction of imperfections in the device at high annealing temperatures. Further, by heating up, the light absorbing layer provides tensile stress to the doped isolation layer 116, which promotes diffusion of dopants from the doped isolation layer 116 into the substrate 102, forming the dopant diffusion region 128. Hence, dopants are diffused into the substrate 102 a sufficient distance so as to improve full well capacity, the number of white pixels, and/or the dark current without impairing device performance.

Figure 2:
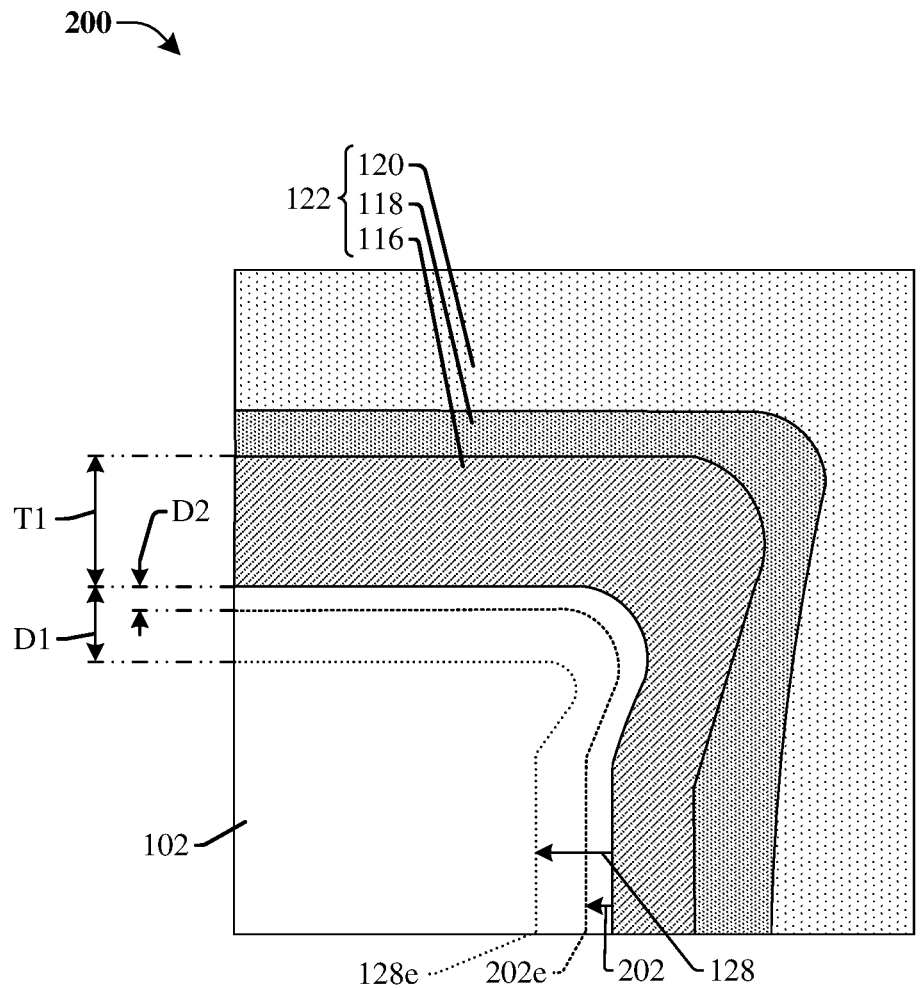
FIG. 2 illustrates a cross-sectional view of some embodiments of an IC comprising a substrate having a light absorbing material diffusion region and a dopant diffusion region extending from a DTI structure into the substrate.

FIG. 2 illustrates a cross-sectional view 200 of some embodiments of an IC comprising a substrate 102 having a light absorbing material diffusion region 202 and a dopant diffusion region 128 extending from a DTI structure 122 into the substrate 102. In some embodiments, the cross-sectional view 200 may be the portion 140 of the IC of FIG. 1. The DTI structure 122 comprises a doped isolation layer 116 having a second doping type (e.g., p-type) and a first thickness T1 disposed between sidewalls of the substrate 102, a high-k dielectric layer 118 disposed between sidewalls of the doped isolation layer 116, and an isolation filler structure 120 disposed between sidewalls of the high-k dielectric layer 118. The first thickness T1 is measured along a lateral portion of the DTI structure 122 directly overlying the substrate 102.

The dopant diffusion region 128 is a portion of the substrate 102 that is more heavily doped with the second doping type. The dopant diffusion region 128 extends into the substrate 102 from the doped isolation layer 116 to an outer edge 128e. The doped isolation layer 116 and the dopant diffusion region 128 collectively isolate the image sensing elements 104a, 104b from one another during the operation, and the dopant diffusion region 128 extends a sufficient distance into the substrate 102 so as to improve full well capacity, the number of white pixels, and/or the dark current without impairing device performance. The light absorbing material diffusion region 202 is a portion of the substrate 102 that comprises particles of light absorbing material. The light absorbing material diffusion region 202 extends into the substrate 102 from the doped isolation layer 116 to an outer edge 202e.

The dopant diffusion region 128 extends from the doped isolation layer 116 into the substrate 102 by a first distance D1. The light absorbing material diffusion region 202 extends from the doped isolation layer 116 into the substrate 102 by a second distance D2 that is less than the first distance D1.

In some embodiments, the first thickness T1 may range from approximately 1 nanometer to approximately 10 nanometers, approximately 5 nanometers to approximately 10 nanometers, approximately 1 nanometer to approximately 5 nanometers, or some other suitable value. In some embodiments, if the first thickness T1 is too small (e.g., below 1 nanometer), the doped isolation layer 116 may be unable to effectively isolate the image sensing elements (not shown) from one another. In some embodiments, if the first thickness T1 is too large (e.g., above 10 nanometers), a film quality of the doped isolation layer 116 may degrade.

In some embodiments, the first distance D1 may range from approximately 5 nanometers to approximately 10 nanometers, approximately 5 nanometers to approximately 7 nanometers, approximately 7 nanometers to approximately 10 nanometers, or some other suitable value. In some embodiments, if the first distance D1 is too small (e.g., below 5 nanometers), the dopant diffusion region 128 may be unable to effectively isolate the image sensing elements (not shown) from one another. In some embodiments, if the first distance D1 is too large (e.g., above 10 nanometers), a method for forming the dopant diffusion region 128 may result in impaired device performance. In some embodiments, the second distance D2 may range from approximately 1 nanometer to approximately 3 nanometers, approximately 2 nanometers to approximately 3 nanometers, or some other suitable value.

Figure 3:
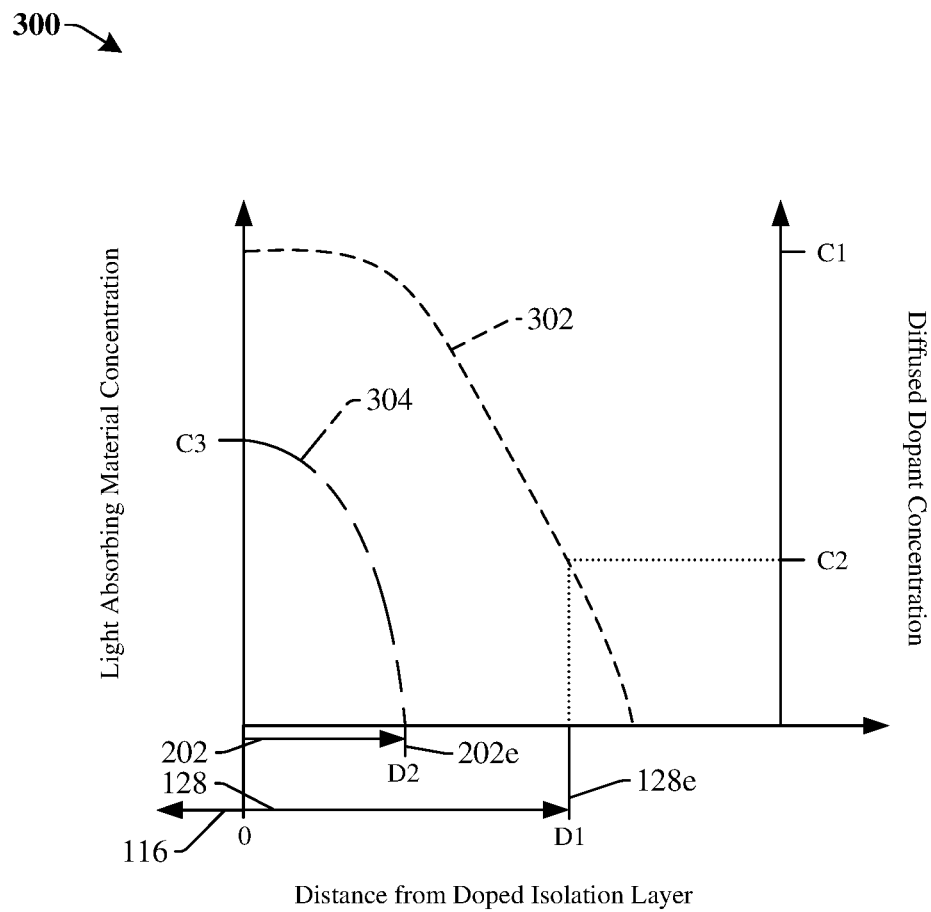
FIG. 3 illustrates a graphical representation of some embodiments of a relationship between a concentration of light absorbing material and dopants in a substrate and distance from a doped isolation layer.

FIG. 3 illustrates a graphical representation 300 of some embodiments of a relationship between a concentration of light absorbing material and diffused dopants in a substrate of an IC and distance from a doped isolation layer 116 of an IC, such as the IC of FIG. 2. A first curve 302 corresponds to a concentration of diffused dopants (e.g., p-type dopants) in a dopant diffusion region 128 of a substrate. A second curve 304 corresponds to a concentration of light absorbing material in a light absorbing material diffusion region 202 of a substrate. In some embodiments, the light absorbing material may be or comprise, for example, germanium or some other suitable material(s). So, for example, if the substrate is a monocrystalline silicon substrate, the monocrystalline silicon substrate may include p-type dopants according to the first curve 302 and germanium atoms according to the second curve 304.

The first curve 302 has a first concentration C1 at a distance of approximately 0 nanometers away from the doped isolation layer 116. The concentration of the first curve 302 gradually decreases as the distance from the doped isolation layer 116 increases. At a first distance D1, the first curve 302 has a second concentration C2 of diffused dopants that is equal to the concentration of dopants in the substrate. Since the substrate comprises a highly doped dopant diffusion region 128 that extends a sufficient distance (e.g., the first distance D1) away from the doped isolation layer 116, the full well capacity, the number of white pixels, and/or the dark current of the device are improved without impairing performance.

The second curve 304 has a third concentration C3 at a distance of approximately 0 nanometers away from the doped isolation layer 116. The concentration of the second curve 304 gradually decreases as the distance from the doped isolation layer 116 increases, until the concentration reaches 0 at a second distance D2.

In some embodiments, the first concentration C1 may range from approximately $10^{19}$ atoms per cubic centimeter to $3 \times 10^{19}$ atoms per cubic centimeter, approximately $2 \times 10^{19}$ atoms per cubic centimeter to $3 \times 10^{19}$ atoms per cubic centimeter, approximately $10^{19}$ atoms per cubic centimeter to $2 \times 10^{19}$ atoms per cubic centimeter, or some other suitable value. In some embodiments, the second concentration C2 may range from approximately $10^{17}$ atoms per cubic centimeter to $5 \times 10^{17}$ atoms per cubic centimeter, approximately $2 \times 10^{17}$ atoms per cubic centimeter to $5 \times 10^{17}$ atoms per cubic centimeter, approximately $10^{17}$ atoms per cubic centimeter to $2 \times 10^{17}$ atoms per cubic centimeter, or some other suitable value. In some embodiments, the third concentration C3 may be less than approximately 3% by molar ratio. For example, in embodiments in which the substrate comprises silicon and the light absorbing material comprises germanium, the substrate may have a composition $Si_xGe_y$, where x is greater than 0.97 and less than 1, and y is less than 0.03 and greater than 0. In some embodiments, the first distance D1 and the second distance D2 may be as described with respect to the first distance D1 and the second distance D2 of FIG. 2.

Figure 4:
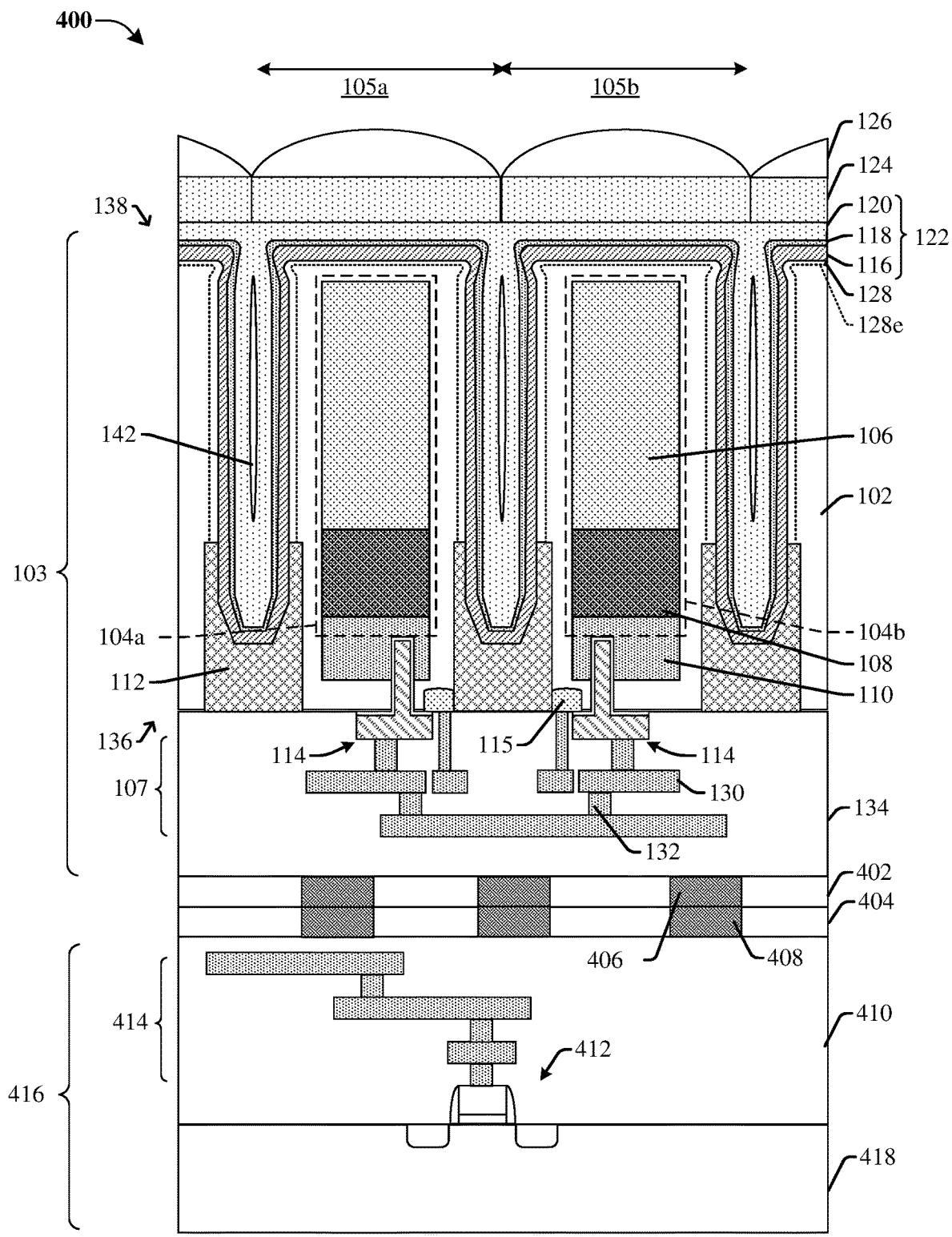
FIG. 4 illustrates a cross-sectional view of some alternative embodiments of the IC of FIG. 1 in which the image sensing die is bonded together with a logic die.

FIG. 4 illustrates a cross-sectional view 400 of some alternative embodiments of the IC of FIG. 1 in which the image sensing die 103 is bonded together with a logic die 416. The logic die 416 may comprise logic devices 412 disposed over a logic substrate 418. The logic die 416 may further comprise a metallization stack 414 disposed within a second ILD structure 410 overlying the logic devices 412. The image sensing die 103 and the logic die 416 may be bonded face-to-face, face-to-back, or back-to-back. As an example, FIG. 4 shows a face-to-face bonding structure where a pair of intermediate bonding dielectric layers 402, 404, and bonding pads 406, 408 are arranged between the image sensing die 103 and the logic die 416 and respectively bond the metallization stacks 107, 414 through a fusion or a eutectic bonding structure.

In some embodiments, the bonding pads 406, 408 and the metallization stack 414 are or comprise, for example, copper, aluminum, some other suitable metal(s), or a combination of the foregoing. In some embodiments, the second ILD structure 410 and the intermediate bonding dielectric layers 402, 404 may be or comprise, for example, nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like.

Figure 5:
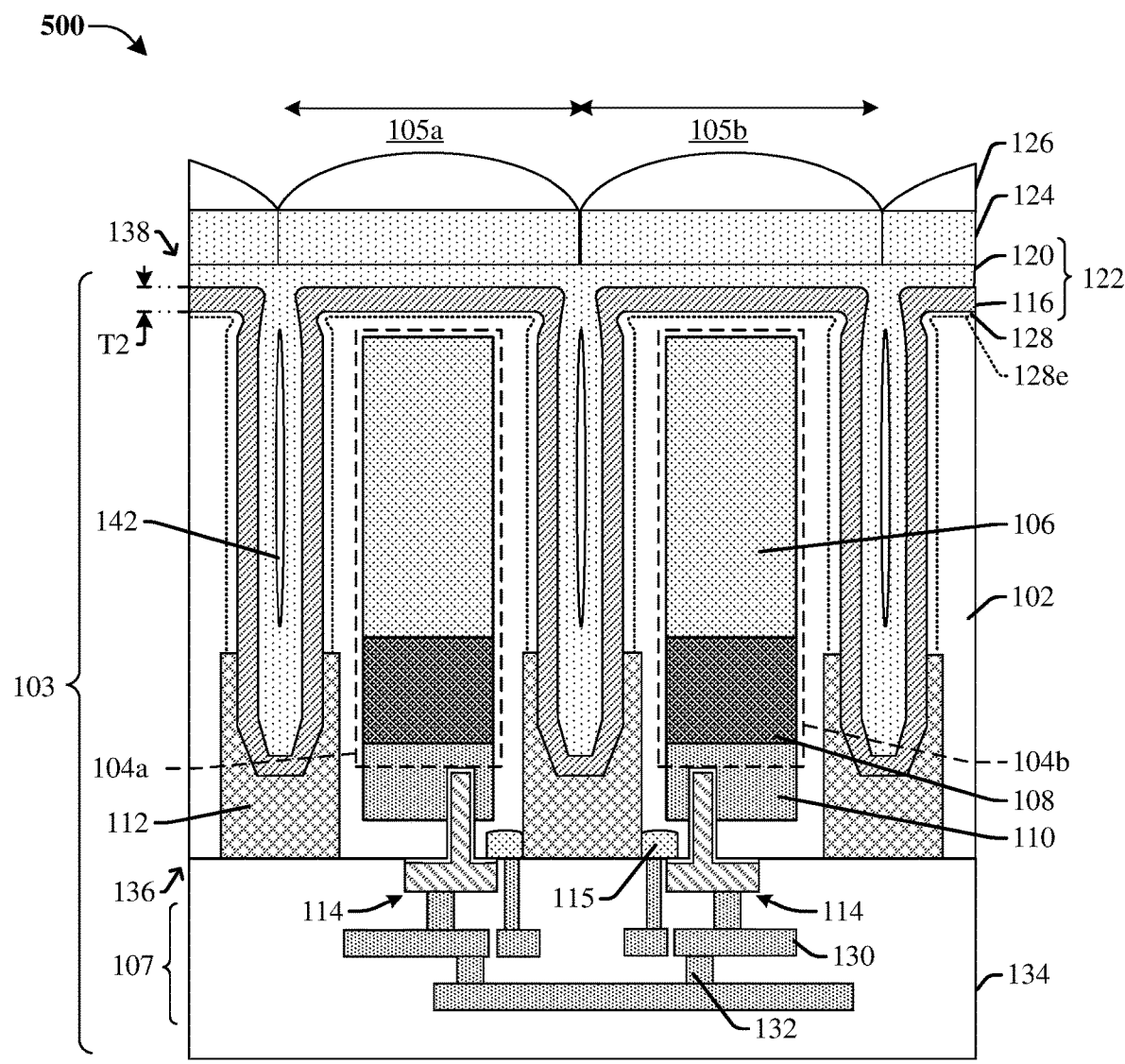
FIG. 5 illustrates a cross-sectional view of some alternative embodiments of the IC of FIG. 1 in which the DTI structure is varied.

FIG. 5 illustrates a cross-sectional view 500 of some alternative embodiments of the IC of FIG. 1 in which the DTI structure 122 is varied. The DTI structure 122 is as described in FIG. 1, but the high-k dielectric layer 118 is omitted. Further, the doped isolation layer 116 has a second thickness T2 directly overlying the image sensing elements 104a, 104b that is greater than the first thickness T1 as described in FIG. 2 to passivate defects and sufficiently isolate in lieu of a high-k dielectric layer. In some embodiments, the second thickness T2 ranges from approximately 10 nanometers to approximately 15 nanometers, from approximately 10 nanometers to approximately 12 nanometers, from approximately 12 nanometers to approximately 15 nanometers, or some other acceptable value.

Figure 6:
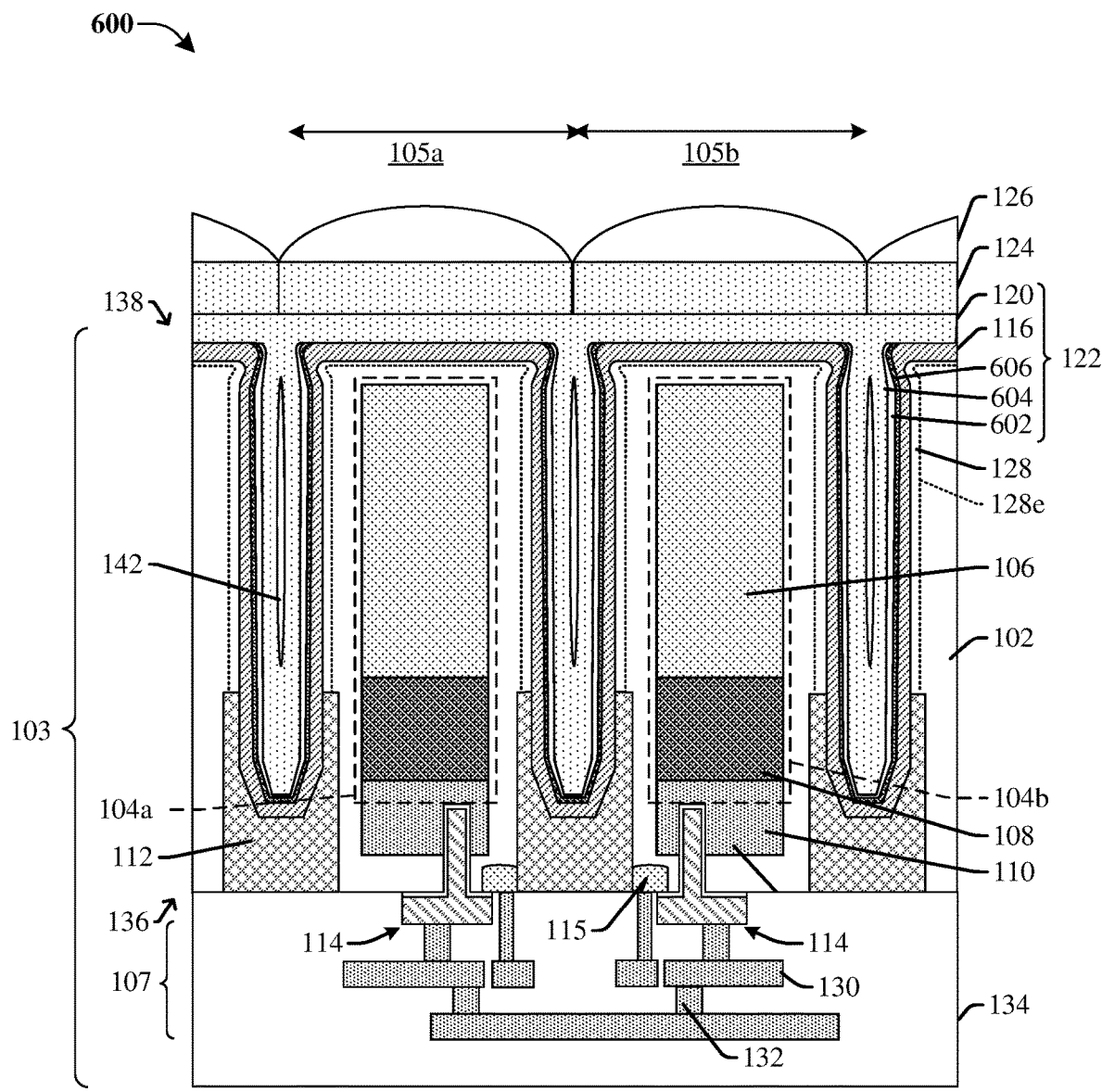
FIG. 6 illustrates a cross-sectional view of some alternative embodiments of the IC of FIG. 1 in which the DTI structure comprises a light absorbing layer disposed along sidewalls of an isolation filler structure.

FIG. 6 illustrates a cross-sectional view 600 of some alternative embodiments of the IC of FIG. 1 in which the DTI structure 122 comprises a light absorbing layer 604 disposed along sidewalls of an isolation filler structure 120. The high-k dielectric layer 118 of FIG. 1 is omitted, and an insulating layer 606 is disposed along inner sidewalls of the doped isolation layer 116. A diffusion enhancement layer 602 is disposed along inner sidewalls of the insulating layer 606. The light absorbing layer 604 is disposed along inner sidewalls of the diffusion enhancement layer 602, and the isolation filler structure 120 is disposed between inner sidewalls of the light absorbing layer 604.

In some embodiments, a top surface of the diffusion enhancement layer 602, a top surface of the light absorbing layer 604, a top surface of the insulating layer 606, and a top surface of the doped isolation layer 116 may directly contact a bottom surface of the isolation filler structure 120. In alternative embodiments, the diffusion enhancement layer 602, the light absorbing layer 604, and the insulating layer 606 each comprise a lateral portion that continuously extends directly over the image sensing elements 104a, 104b. In some embodiments, the diffusion enhancement layer 602 may comprise the second doping type (e.g., p-type).

Figure 7A:
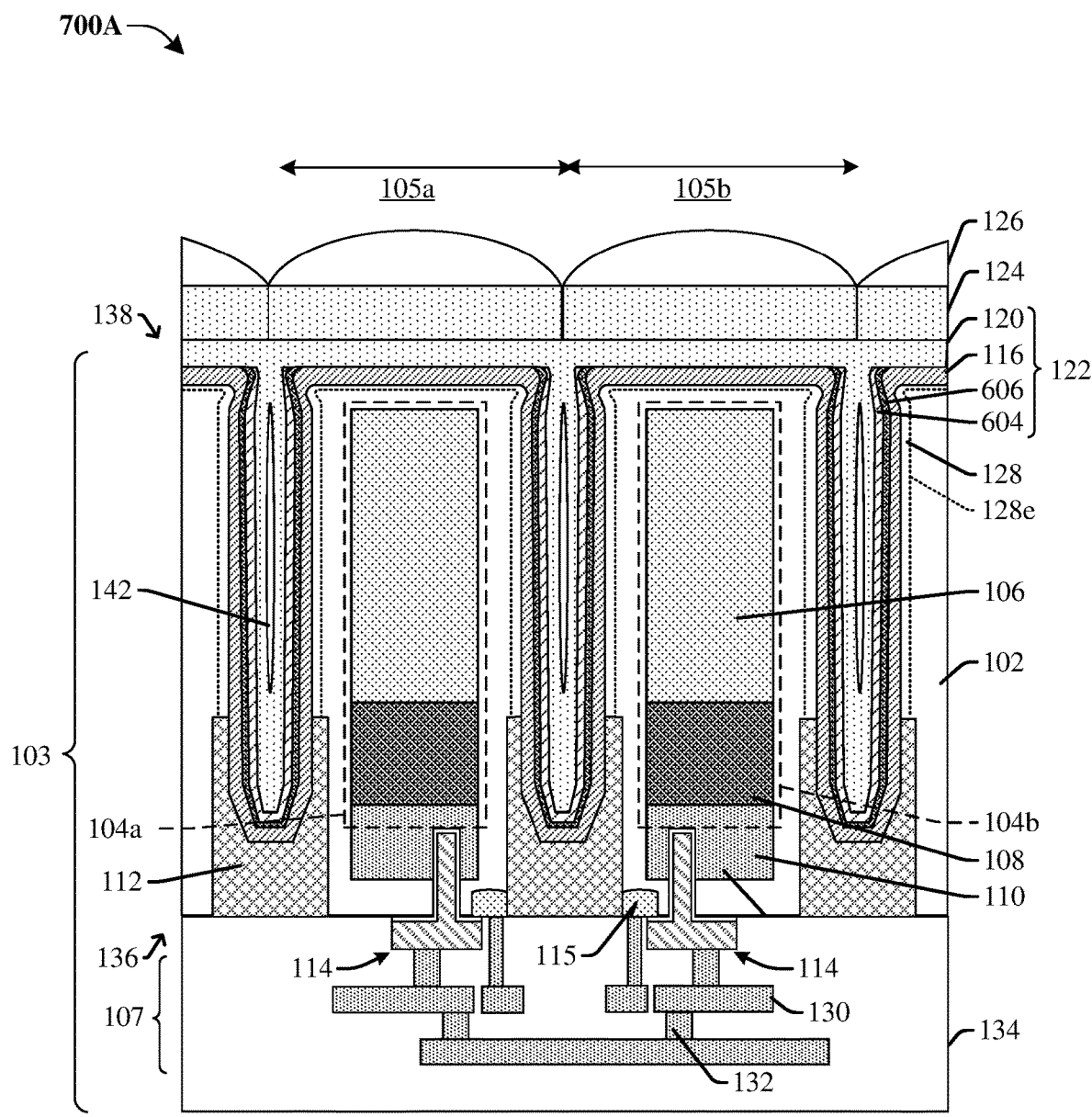
FIGS. 7A-7B illustrate cross-sectional views of some alternative embodiments of the IC of FIG. 6 in which the DTI structure is further varied.
Figure 7B:
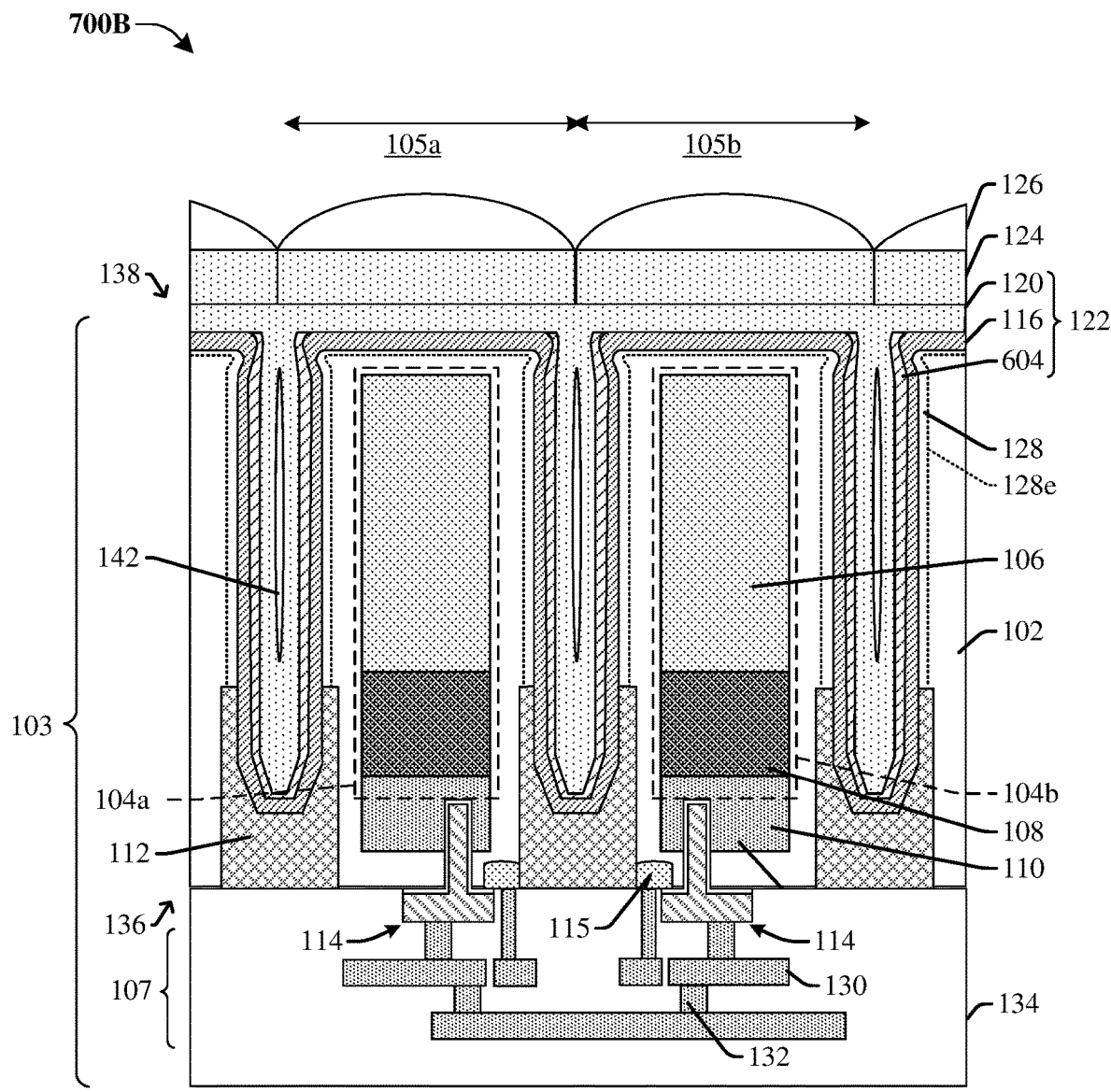

FIGS. 7A-7B illustrate cross-sectional views 700A-700B of some alternative embodiments of the IC of FIG. 6 in which the DTI structure 122 is further varied.

With respect to cross-sectional view 700A of FIG. 7A, some alternative embodiments of the IC of FIG. 6 are illustrated. The DTI structure 122 is as described with respect to FIG. 6, but the diffusion enhancement layer 602 is omitted. The light absorbing layer 604 is disposed along inner sidewalls of the insulating layer 606. In some embodiments, this may save material costs at the expense of diffusion distance. Particularly, without the diffusion enhancement layer 602, during fabrication, the outer edge 128e of the dopant diffusion region 128 may be closer to the doped isolation layer 116.

With respect to cross-sectional view 700B of FIG. 7B, some alternative embodiments of the IC of FIG. 6 are illustrated. The DTI structure 122 is as described with respect to FIG. 6, but the diffusion enhancement layer 602 and the insulating layer 606 are omitted. The light absorbing layer 604 is disposed along inner sidewalls of the doped isolation layer 116. In some embodiments, this may save material costs at the expense of the formation of dislocations in the doped isolation layer 116 during fabrication.

Figure 8:
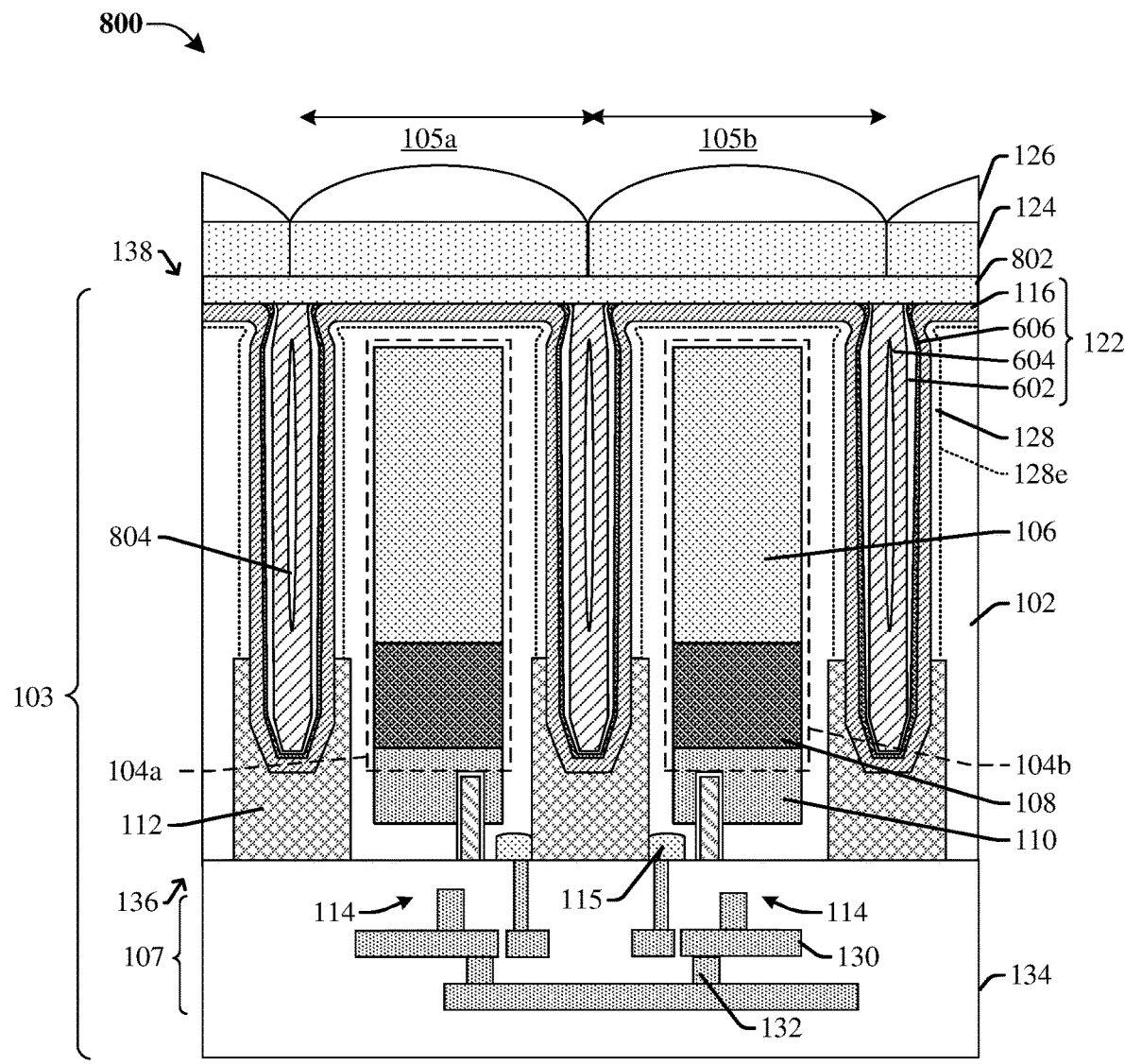
FIG. 8 illustrates a cross-sectional view of some alternative embodiments of the IC of FIG. 1 in which the DTI structure comprises a light absorbing layer entirely below an overlying isolation structure.

FIG. 8 illustrates a cross-sectional view 800 of some alternative embodiments of the IC of FIG. 1 in which the DTI structure 122 comprises a light absorbing layer 604 entirely below an overlying isolation structure 802. The high-k dielectric layer 118 of FIG. 1 is omitted. An insulating layer 606 is disposed along inner sidewalls of the doped isolation layer 116. A diffusion enhancement layer 602 is disposed along inner sidewalls of the insulating layer 606. The light absorbing layer 604 is disposed between inner sidewalls of the diffusion enhancement layer 602. In some embodiments, the light absorbing layer 604 comprises a void or air gap 804. In some of such embodiments, the light absorbing layer 604 and the void or air gap 804 entirely fill the remaining space of the deep trench. The light absorbing layer 604 continuously extends between inner sidewalls of the diffusion enhancement layer 602. In some embodiments, the light absorbing layer 604 entirely fills the space between inner sidewalls of the diffusion enhancement layer 602.

The isolation filler structure 120 of FIG. 1 is omitted. The overlying isolation structure 802 separates the plurality of color filters 124 from the DTI structure 122. A bottommost surface of the overlying isolation structure contacts an upper surface of the doped isolation layer 116. In some embodiments, the overlying isolation structure 802 comprises silicon dioxide, silicon nitride, or some other suitable dielectric material(s).

Figure 9A:
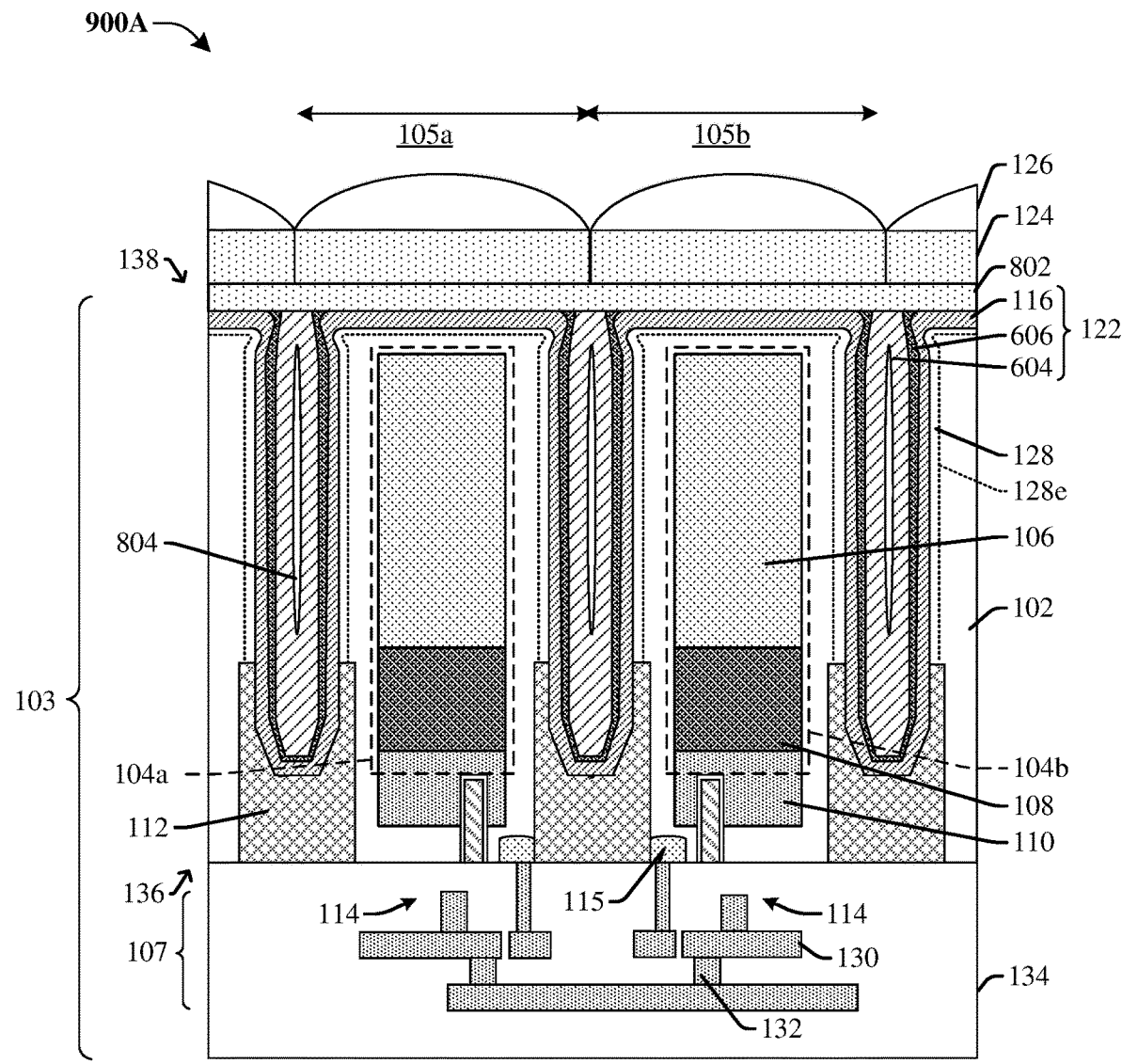
FIGS. 9A-9B illustrate cross-sectional views of some alternative embodiments of the IC of FIG. 8 in which the DTI structure is further varied.
Figure 9B:
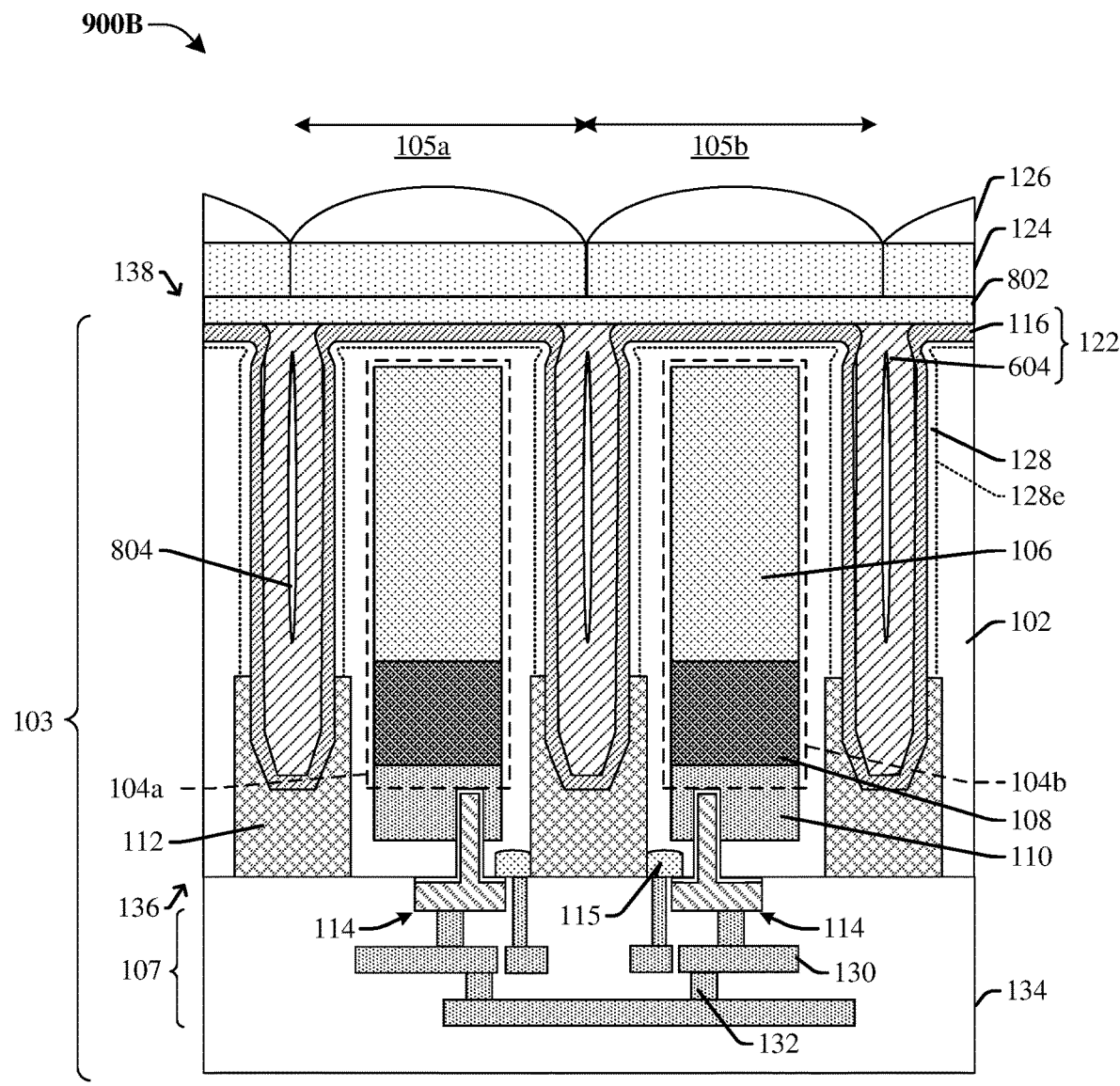

FIGS. 9A-9B illustrate cross-sectional views 900A-900B of some alternative embodiments of the IC of FIG. 8 in which the DTI structure 122 is varied.

With respect to cross-sectional view 900A of FIG. 9A, some alternative embodiments of the IC of FIG. 8 are illustrated. The DTI structure 122 is as described with respect to FIG. 8, but the diffusion enhancement layer 602 is omitted. The light absorbing layer 604 is disposed along inner sidewalls of the insulating layer 606. In some embodiments, the light absorbing layer 604 entirely fills the space between the inner sidewalls of the insulating layer 606. In some embodiments, this may save material costs at the expense of diffusion distance. Particularly, without the diffusion enhancement layer 602, during fabrication, the outer edge 128e of the dopant diffusion region 128 may be closer to the doped isolation layer 116.

With respect to cross-sectional view 900B of FIG. 9B, some alternative embodiments of the IC of FIG. 8 are illustrated. The DTI structure 122 is as described with respect to FIG. 8, but the diffusion enhancement layer 602 and the insulating layer 606 are omitted. The light absorbing layer 604 is disposed along inner sidewalls of the doped isolation layer 116. In some embodiments, the light absorbing layer 604 entirely fills the space between the inner sidewalls of the doped isolation layer. In some embodiments, this may save material costs at the expense of the formation of dislocations in the doped isolation layer 116 during fabrication.

FIGS. 10-21, 22A-22B, 23A-23E, 24A-24D, and 25A-25D illustrate a series of cross-sectional views 1000-2100, 2200A-2200B, 2300A-2300E, 2400A-2400D, and 2500A-2500D of various embodiments of a method for using a light absorbing layer 604 to form an IC comprising a substrate 102 having a dopant diffusion region 128 extending from a DTI structure 122 into the substrate 102.

Figure 10:
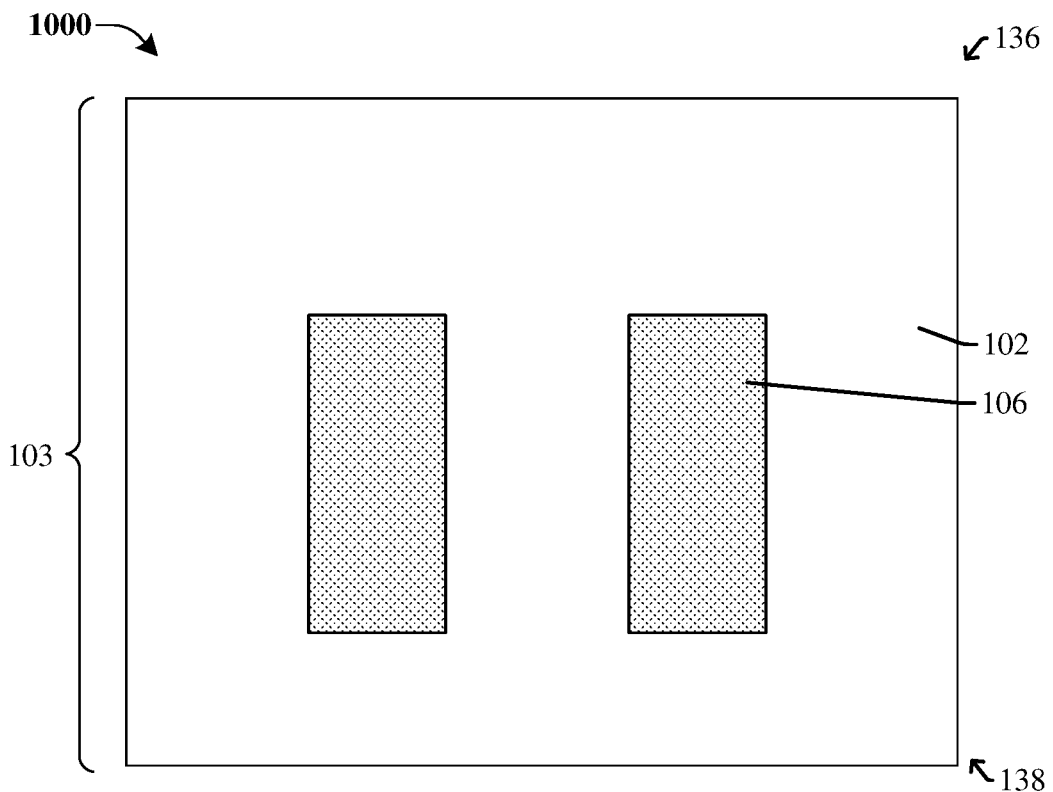
FIGS. 10-21, 22A-22B, 23A-23E, 24A-24D, and 25A-25D illustrate a series of cross-sectional views of various embodiments of a method for using a light absorbing layer to form an IC comprising a substrate having a dopant diffusion region extending from a DTI structure into the substrate.

As illustrated by the cross-sectional view 1000 of FIG. 10, in some embodiments, a plurality of deep well regions 106 is formed on or within a substrate 102 of an image sensing die 103. In some embodiments, the plurality of deep well regions 106 is formed of a first doping type (e.g., n-type) by a doping process. In some embodiments, the doping process may be or comprise, for example, implanting ions having the first doping type (e.g., phosphorous, arsenic, or some other suitable dopant species), or some other suitable doping process.

Figure 11:
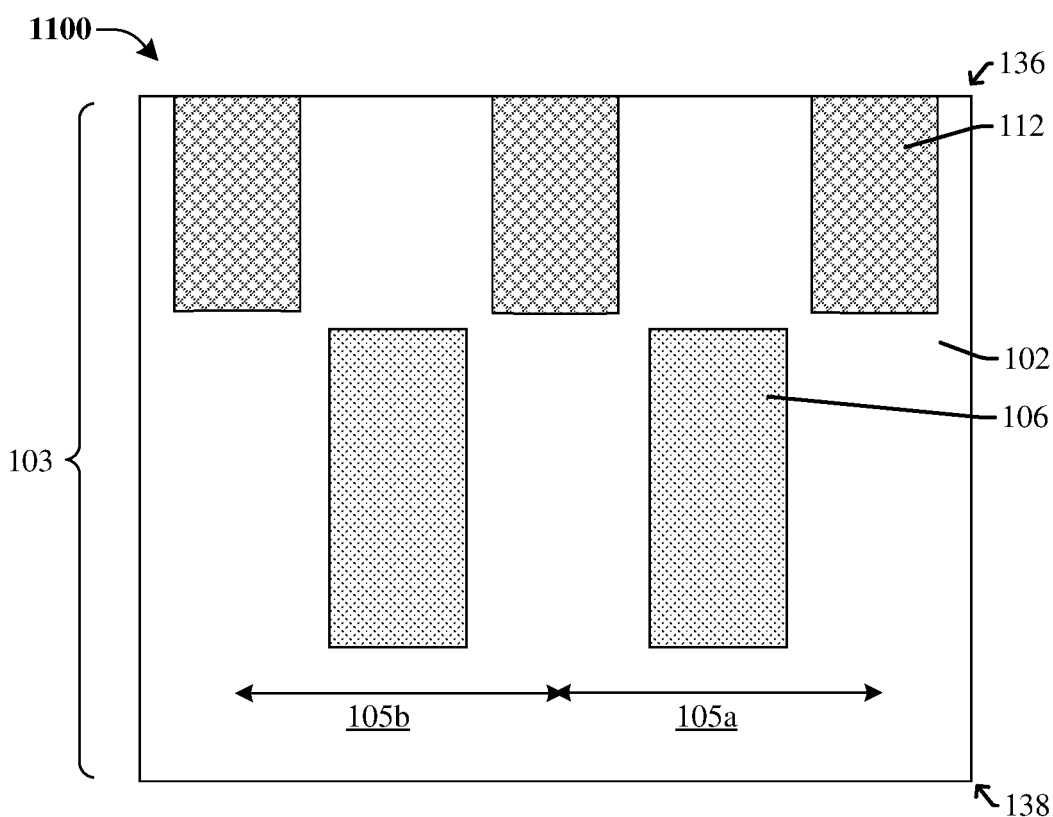

As illustrated by the cross-sectional view 1100 of FIG. 11, in some embodiments, a plurality of isolation wells 112 having a second doping type opposite the first doping type (e.g., p-type) are formed into the substrate 102 between adjacent pixel regions 105a, 105b from a frontside 136 of the substrate 102 to a position within the substrate 102. In some embodiments, the plurality of isolation wells 112 may be formed by, for example, a doping process. In some embodiments, the doping process may comprise implanting ions having the second doping type (e.g., boron or some other suitable dopant species), into the substrate 102 between adjacent pixel regions 105a, 105b. In some embodiments, the substrate 102 may be selectively implanted according to patterned masking layers (not shown) comprising photoresist.

Figure 12:
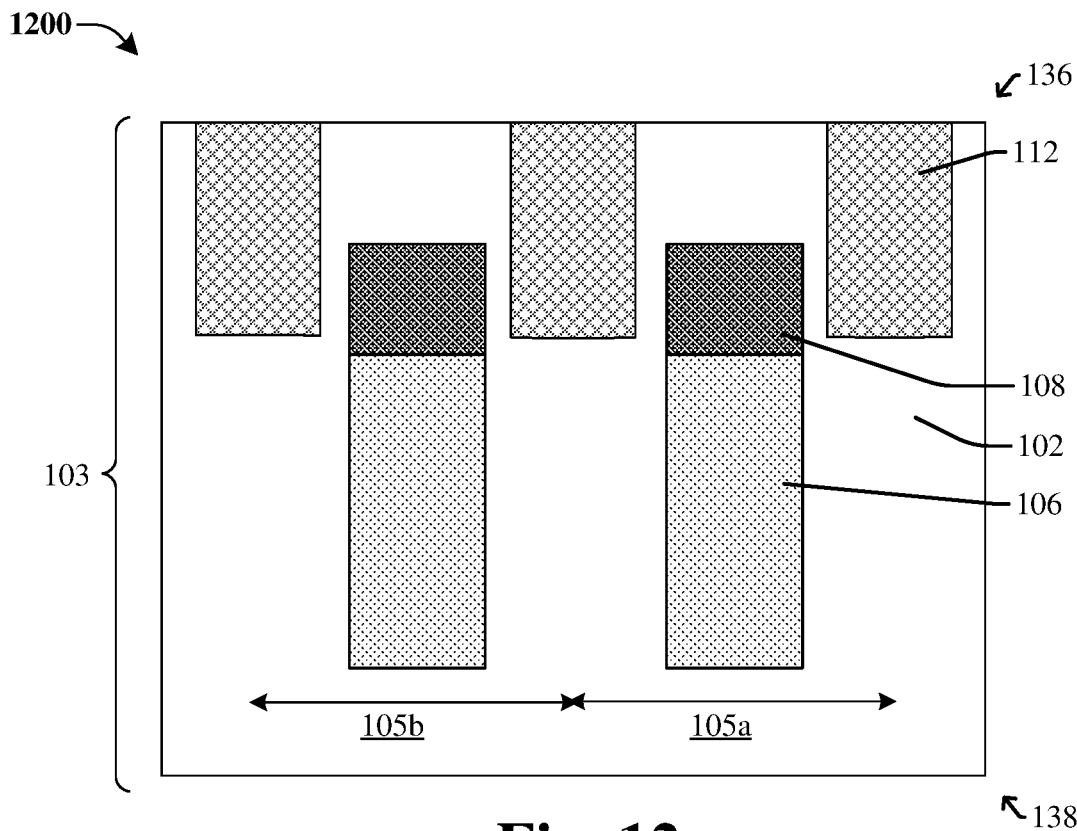

As illustrated by the cross-sectional view 1200 of FIG. 12, in some embodiments, a plurality of deep photodiode regions 108 having the first doping type is formed into the substrate 102 by a doping process. In some embodiments, the plurality of deep photodiode regions 108 are separated from one another by the plurality of isolation wells 112. In some embodiments, the doping process may be or comprise, for example, ion implantation, an n-type epitaxial process, or some other suitable doping process. In some embodiments, the substrate 102 may be selectively implanted according to patterned masking layers (not shown) comprising photoresist. In some embodiments, the plurality of deep photodiode regions 108 has a greater dopant concentration than the plurality of deep well regions 106.

Figure 13:
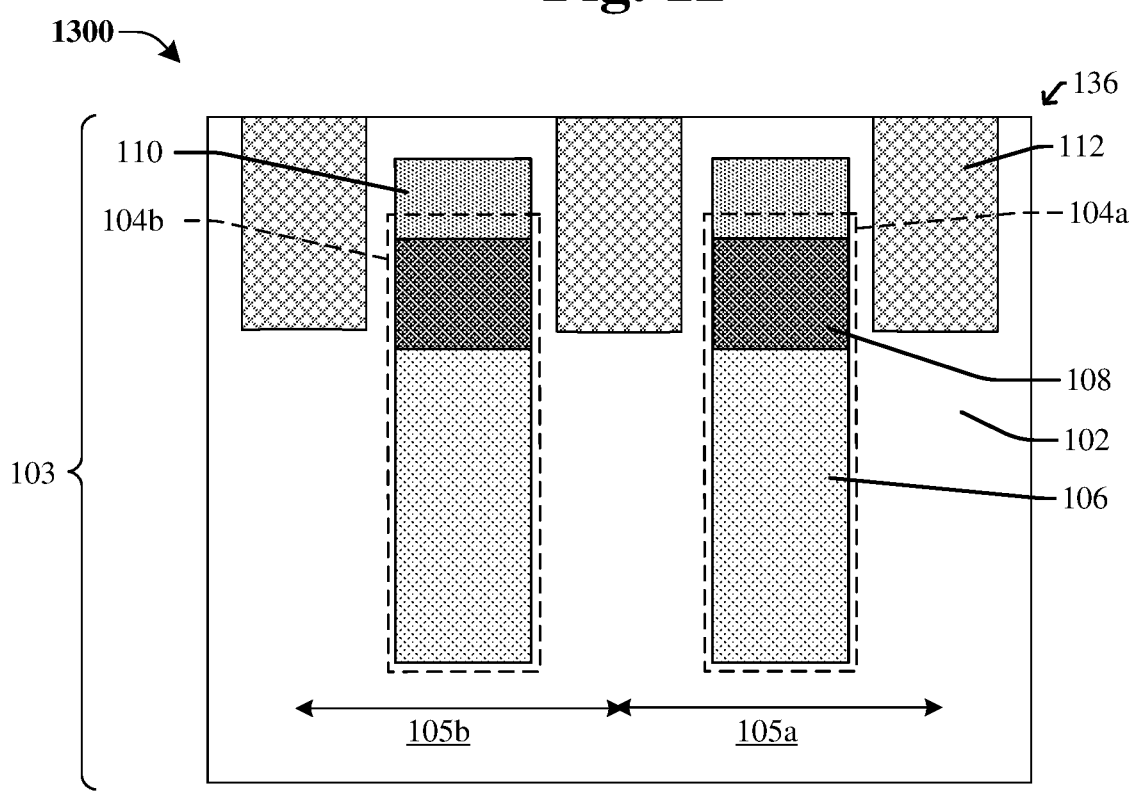

As illustrated by the cross-sectional view 1300 of FIG. 13, in some embodiments, a plurality of pinned photodiode regions 110 having the first doping type is formed into the substrate 102 between the plurality of isolation wells 112. In some embodiments, the plurality of pinned photodiode regions 110 may be formed by, for example, a doping process. In some embodiments, the doping process may comprise implanting n-type dopant species into the substrate 102. In some embodiments, the substrate 102 may be selectively implanted according to patterned masking layers (not shown) comprising photoresist. In some embodiments, the plurality of pinned photodiode regions 110 has a greater dopant concentration than the plurality of deep photodiode regions 108. The plurality of deep well regions 106, the plurality of deep photodiode regions 108, the plurality of pinned photodiode regions 110, and the substrate 102 collectively define a plurality of image sensing elements 104a, 104b.

Figure 14:
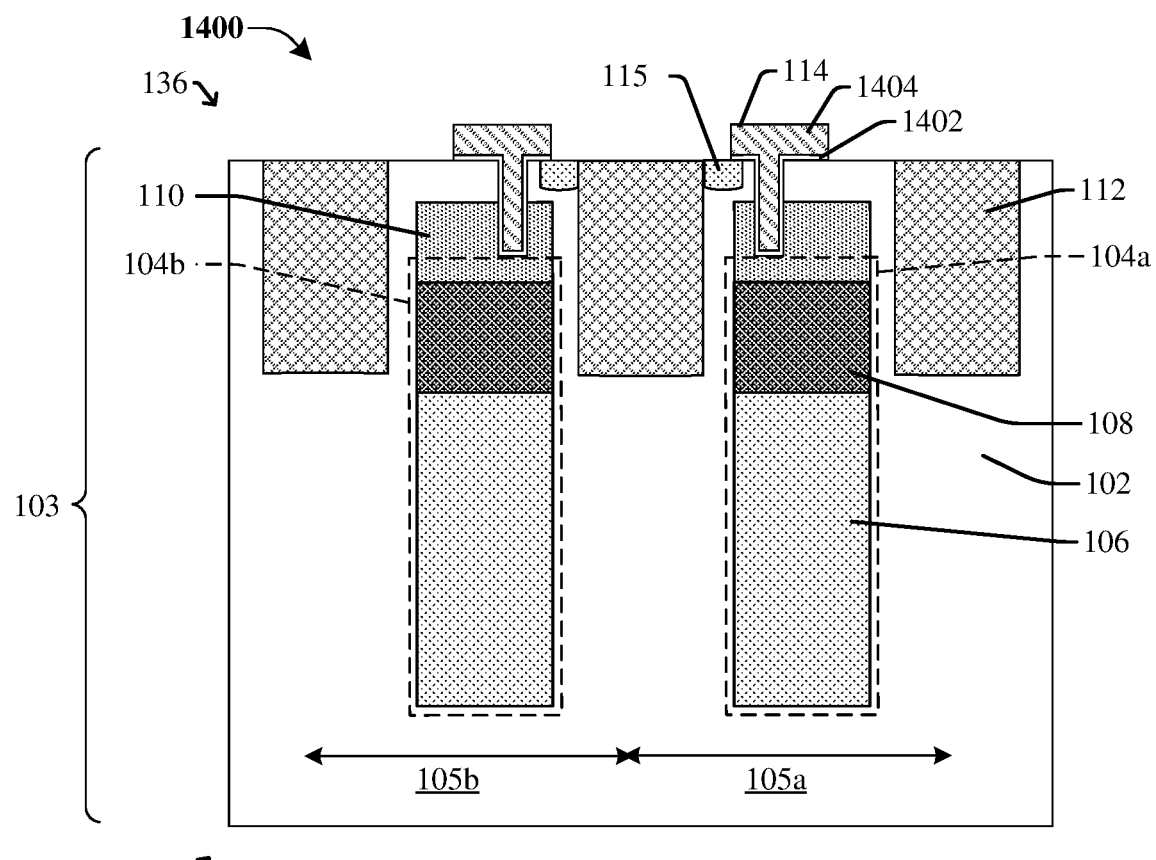

As illustrated by the cross-sectional view 1400 of FIG. 14, in some embodiments, a transfer gate 114 is formed over the frontside 136 of the substrate 102. Further, a floating diffusion well 115 is formed within the substrate 102. The transfer gate 114 extends from the frontside 136 of the substrate 102 to a position within the plurality of pinned photodiode regions 110. The transfer gate 114 may be formed by etching a trench into the substrate 102 and depositing a gate dielectric layer and a gate electrode layer into the trench and over the substrate 102. The gate dielectric layer and the gate electrode layer are subsequently patterned to form a gate dielectric 1402 and a gate electrode 1404. The floating diffusion well 115 may be formed by, for example, a doping process. In some embodiments, the doping process may be or comprise an ion implantation process performed within the frontside 136 of the substrate 102, or some other suitable process. In some embodiments, the floating diffusion well 115 is formed between the transfer gate 114 and one of the pluralities of isolation wells 112. In some embodiments, a plurality of transfer gates 114 may be formed. In some embodiments, a plurality of floating diffusion wells 115 may be formed.

Figure 15:
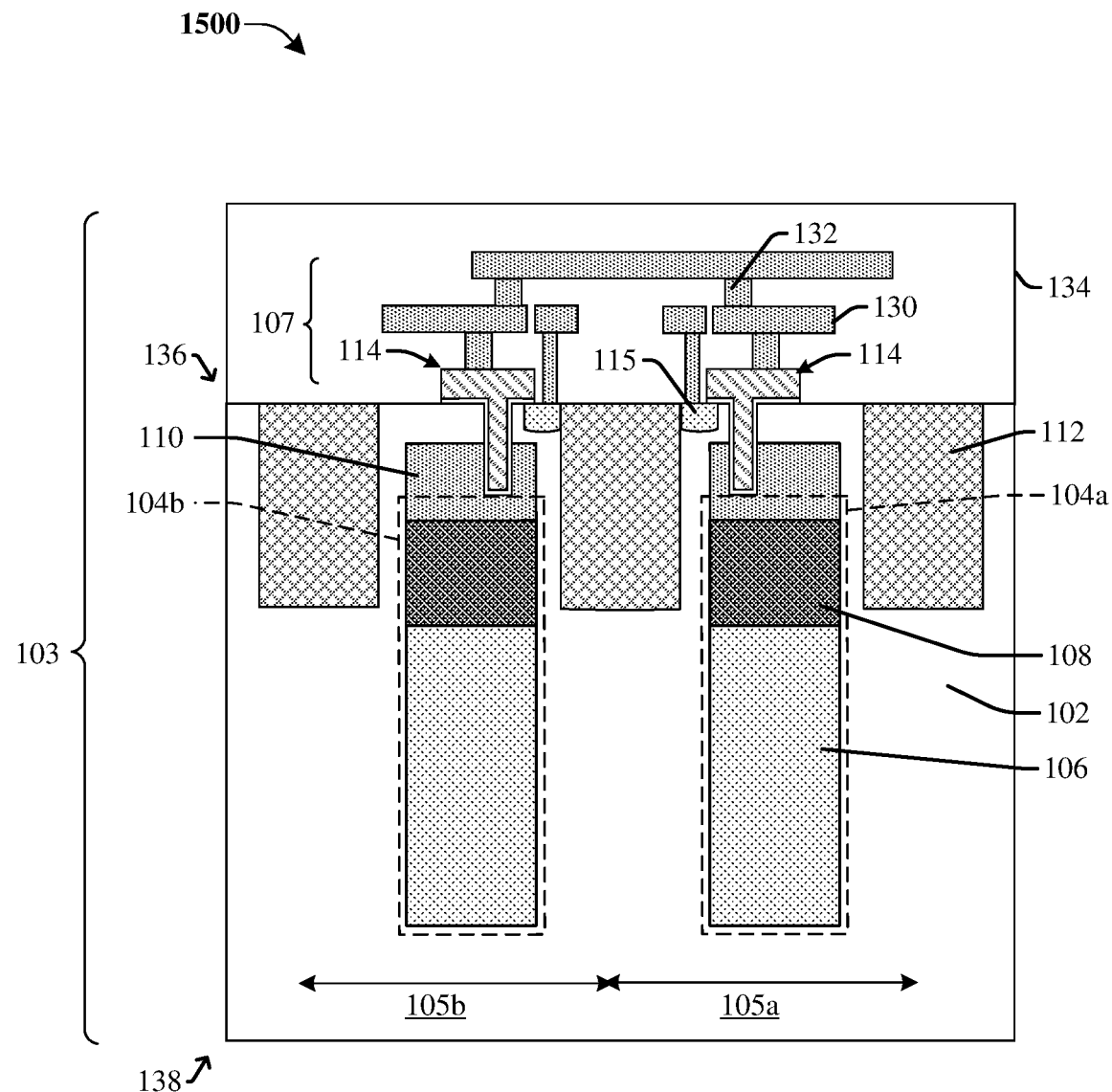

As illustrated by cross-sectional view 1500 of FIG. 15, in some embodiments, a metallization stack 107 may be formed on the frontside 136 of the substrate 102. In some embodiments, the metallization stack 107 may be formed by forming a first ILD structure 134, which comprises one or more layers of ILD material, on the frontside 136 of the substrate 102. The first ILD structure 134 is subsequently etched to form via holes and/or metal trenches. The via holes and/or metal trenches are then filled with a conductive material to form the plurality of metal interconnect vias 132 and metal lines 130. In some embodiments, the first ILD structure 134 may be deposited by physical vapor deposition (PVD), chemical vapor deposition (CVD), or some other suitable deposition process. The plurality of metal interconnect layers may be formed using a deposition process and/or a plating process (e.g., electroplating, electro-less plating, etc.).

Figure 16:
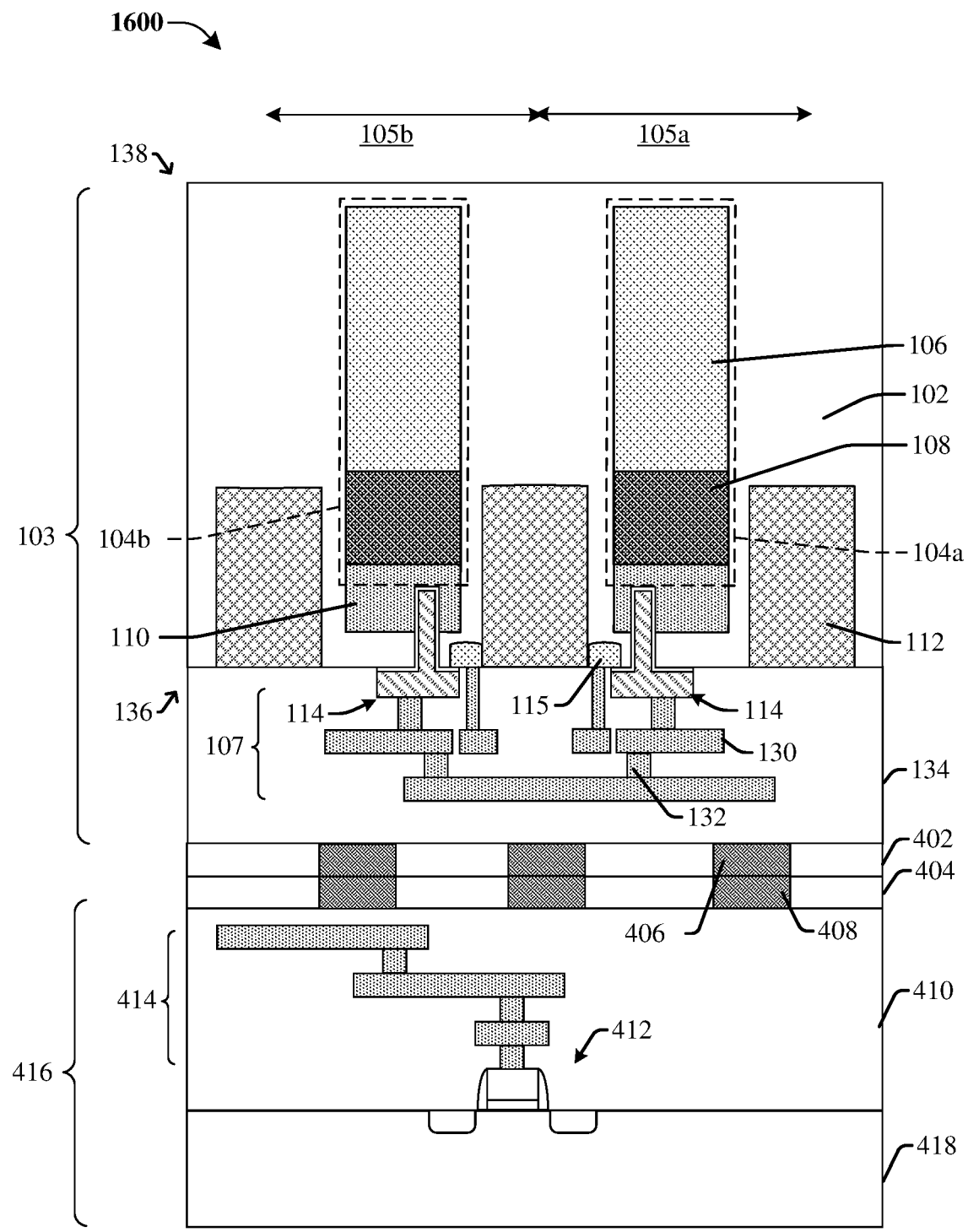

As illustrated by cross-sectional view 1600 of FIG. 16, in some embodiments, the image sensing die 103 can then be bonded to another die. For example, the image sensing die 103 can be bonded to a logic die 416 prepared to have logic devices 412 and a logic substrate 418. The image sensing die 103 and the logic die 416 may be bonded face-to-face, face-to-back, or back-to-back. For example, the bonding process may use a pair of intermediate bonding dielectric layers 402, 404, and bonding pads 406, 408 to bond the metallization stack 107 of the image sensing die 103 to a metallization stack 414 of the logic die 416. The bonding process may comprise a fusion or a eutectic bonding process. The bonding process may also comprise a hybrid bonding process including metal to metal bonding of the bonding pads 406, 408, and dielectric to dielectric bonding of the intermediate bonding dielectric layers 402, 404. An anneal process may follow the hybrid bonding process, and may be performed at a temperature range between about 250 degrees Celsius to about 450 degrees Celsius for a time in a range of about 0.5 hour to about 4 hours, for example.

In some embodiments, the image sensing die 103 is thinned to remove an excess portion of the substrate 102. The image sensing die 103 may be thinned by mechanical grinding the backside 138 of the substrate 102. As an example, the substrate 102 can be firstly grinded, then, an aggressive wet etch can be applied to further thin the substrate 102. An example of the etchant may include hydrogen fluoride/nitric/acetic acid (HNA). A chemical mechanical process and a tetramethylammonium hydroxide (TMAH) wet etching may then follow to further thin the substrate 102 so radiation can pass through the backside 138 of the substrate 102.

Figure 17:
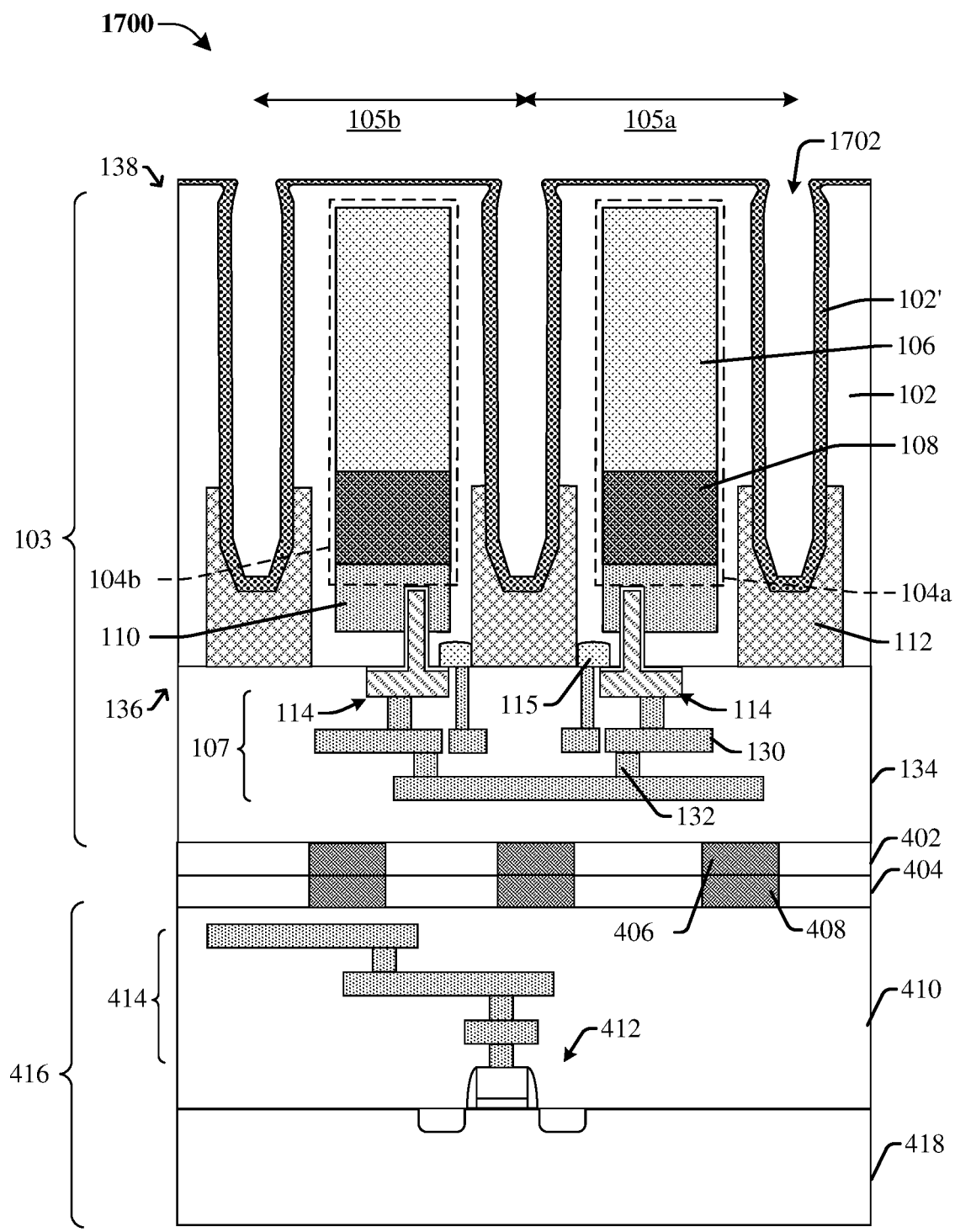

As illustrated in cross-sectional view 1700 of FIG. 17, in some embodiments, the substrate 102 is selectively etched to form deep trenches 1702 within the backside 138 of the substrate 102 laterally separating adjacent image sensing elements 104a, 104b from one another. In some embodiments, the deep trenches 1702 may refer to trenches that extend at least halfway through the substrate 102. In some embodiments, the substrate 102 may be etched by forming a masking layer onto the backside 138 of the substrate 102. The substrate 102 is then exposed to an etchant in regions not covered by the masking layer. The etchant etches the substrate 102 to form the deep trenches 1702 extending into the substrate 102.

In some alternative embodiments, the deep trenches 1702 extend entirely through the substrate 102 and may reach the first ILD structure 134, such that complete isolation is achieved between pixel regions 105a, 105b. In various embodiments, the masking layer may comprise photoresist or a nitride (e.g., SiN) patterned using a photolithography process. The masking layer may also comprise atomic layer deposition (ALD) or plasma enhanced CVD oxide layer. In various embodiments, the etchant may comprise a dry etchant have an etching chemistry comprising a fluorine species (e.g., $CF_4$, $CHF_3$, $C_4F_8$, etc.) or a wet etchant (e.g., hydroflouric acid (HF) or tetramethylammonium hydroxide (TMAH)). Etching the substrate 102 to form the deep trenches 1702 forms a damaged portion 102' of the substrate 102. The damaged portion 102' of the substrate 102 is exposed to the deep trench 1702 and the backside 138 of the substrate 102 as a damage result of the etching process and may include native oxide and other unwanted impurity layers.

Figure 18:
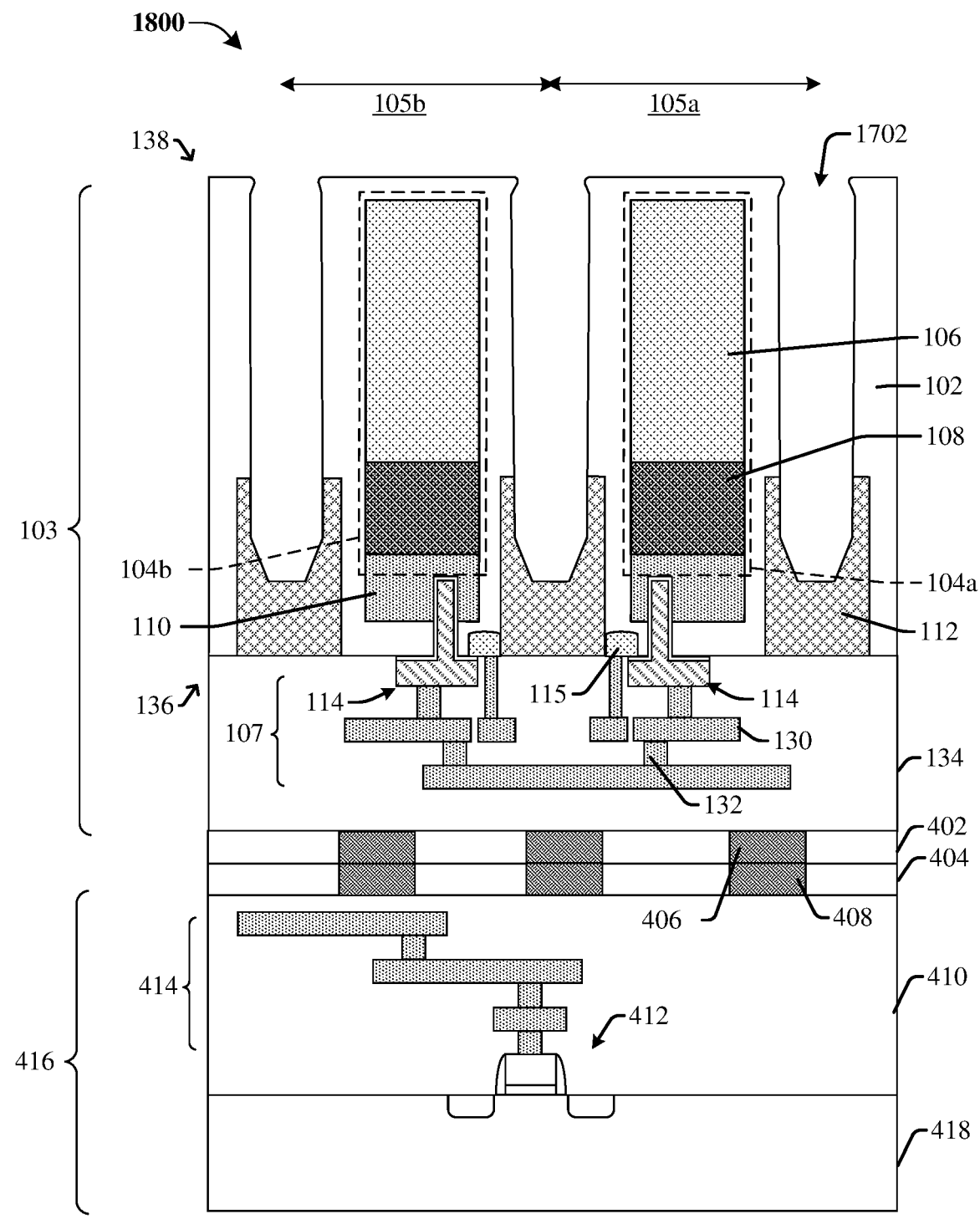

As illustrated by cross-sectional view 1800 of FIG. 18, in some embodiments, a removal process is performed on the substrate 102 to remove the damaged portion 102' and smoothen sidewall surfaces of the deep trenches 1702. The removal process may comprise, for example, a wet etching process and/or a dry etching process to enlarge a lateral dimension of the deep trenches 1702. In various embodiments, the wet etching process comprises exposing the sidewalls of the deep trenches 1702 to a wet etchant (e.g., tetramethylammonium hydroxide (TMAH)). In various embodiments, the dry etching process comprises exposing the sidewalls of the deep trenches 1702 to a dry etchant (e.g., chlorine gas ($H_2$), gaseous hydrochloric acid (HCl), or germane gas ($GeH_4$)). In some embodiments, the dry etching process is performed in-situ, meaning that a chamber used for subsequent formation processes (e.g., low pressure chemical vapor deposition epitaxial tool) is also used for the dry etching process. In some embodiments, the removal process increases the lateral dimension of the deep trenches 1702 by a range between approximately 20 nanometers and approximately 30 nanometers per side, between approximately 25 nanometers and approximately 30 nanometers per side, or some other suitable value.

Figure 19:
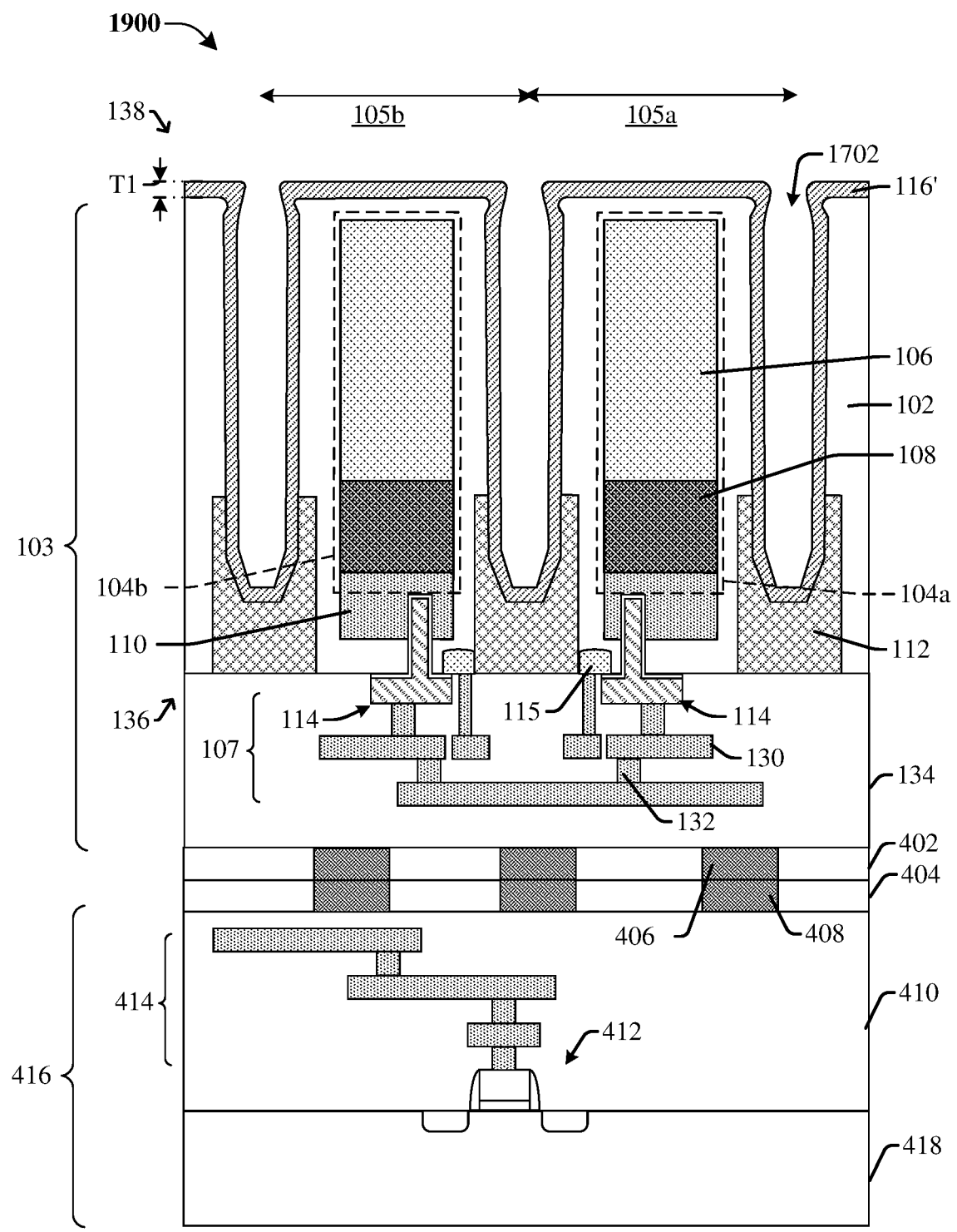

As illustrated by cross-sectional view 1900 of FIG. 19, in some embodiments, an isolation epitaxial precursor 116' is formed into the deep trenches 1702 and over a backside 138 of the substrate 102. In some embodiments, the isolation epitaxial precursor 116' may be formed by a low temperature epitaxial growth process, for example, an epitaxial growth process with a temperature lower than 450 degrees Celsius. Processing gases may comprise silane ($SiH_4$), disilane ($H_6Si_2$), or trisilane ($H_2Si(SiH_3)_2$), diborane ($B_2H_6$), or other applicable gases. In some embodiments, the processing gases may be configured to provide a p-dopant to the isolation epitaxial precursor 116'.

The epitaxial growth process may be performed in a low-pressure chemical vapor deposition epitaxial tool at a pressure less than approximately 200 torr to form an epitaxial doped layer as the isolation epitaxial precursor 116' with a first thickness T1 directly over the image sensing elements 104a, 104b. In some embodiments, the isolation epitaxial precursor 116' has a thickness along inner sidewalls of the substrate 102 that is less than the first thickness T1. The first thickness T1 may range from approximately 1 nanometer to approximately 10 nanometers, approximately 5 nanometers to approximately 10 nanometers, approximately 1 nanometer to approximately 5 nanometers, or some other suitable value. The forming temperature should not be higher than 450 degrees Celsius since a higher forming temperature would cause a lower dopant concentration and an increased roughness. The isolation epitaxial precursor 116' is formed on the smoothened sidewall surfaces of the deep trenches 1702 and results in a better conformity than conventional beamline implant technique, which suffers shadowing effect for three-dimensional structure and thus cannot achieve desired conformity. A concentration of the p-dopant (e.g., boron) can be in a range from approximately $10^{19}$ atoms per cubic centimeter to $3 \times 10^{19}$ atoms per cubic centimeter, approximately $2 \times 10^{19}$ atoms per cubic centimeter to $3 \times 10^{19}$ atoms per cubic centimeter, approximately $10^{19}$ atoms per cubic centimeter to $2 \times 10^{19}$ atoms per cubic centimeter, or some other suitable value. The concentration of the p-dopant may further be different than that of the substrate 102. A thinner isolation epitaxial precursor 116' or a smaller concentration of dopants may prevent dopants from being diffused into the substrate 102 a sufficient distance so as to effectively isolate the plurality of image sensing elements 104a, 104b from one another.

Figure 20:
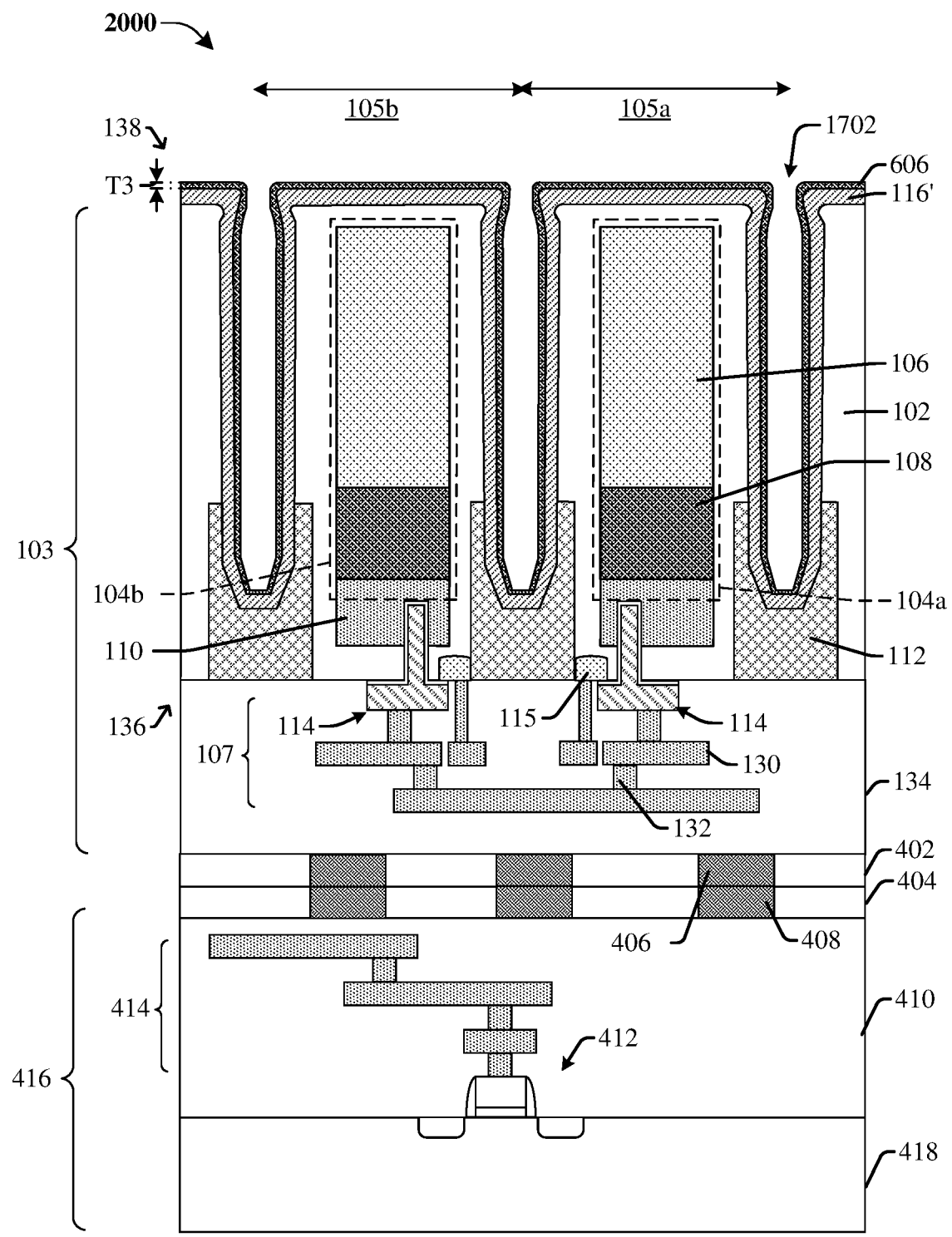

As illustrated by cross-sectional view 2000 of FIG. 20, in some embodiments, an insulating layer 606 is formed into the deep trenches 1702 and over the isolation epitaxial precursor 116'. The insulating layer 606 prevents the formation of dislocations in the subsequently formed doped isolation layer 116 during a subsequently performed dopant activation process. In some embodiments, the insulating layer 606 may be deposited by PVD, CVD, or some other suitable deposition process. In some embodiments, the insulating layer 606 may be a native oxide of the isolation epitaxial precursor 116', and may be formed by exposing the insulating layer 606 to air.

The insulating layer 606 has a third thickness T3 directly over the image sensing elements 104a, 104b. In some embodiments, the insulating layer 606 has a thickness along inner sidewalls of the isolation epitaxial precursor 116' that is less than the third thickness T3. In some embodiments, the third thickness T3 may range from approximately 0.1 nanometer to approximately 3 nanometers, approximately 0.1 nanometers to approximately 1 nanometer, approximately 1 nanometer to approximately 2 nanometers, or some other suitable value. In some embodiments, the insulating layer 606 may be or comprise, for example, silicon dioxide, silicon nitride, silicon oxynitride, or some other suitable material(s).

Figure 21:
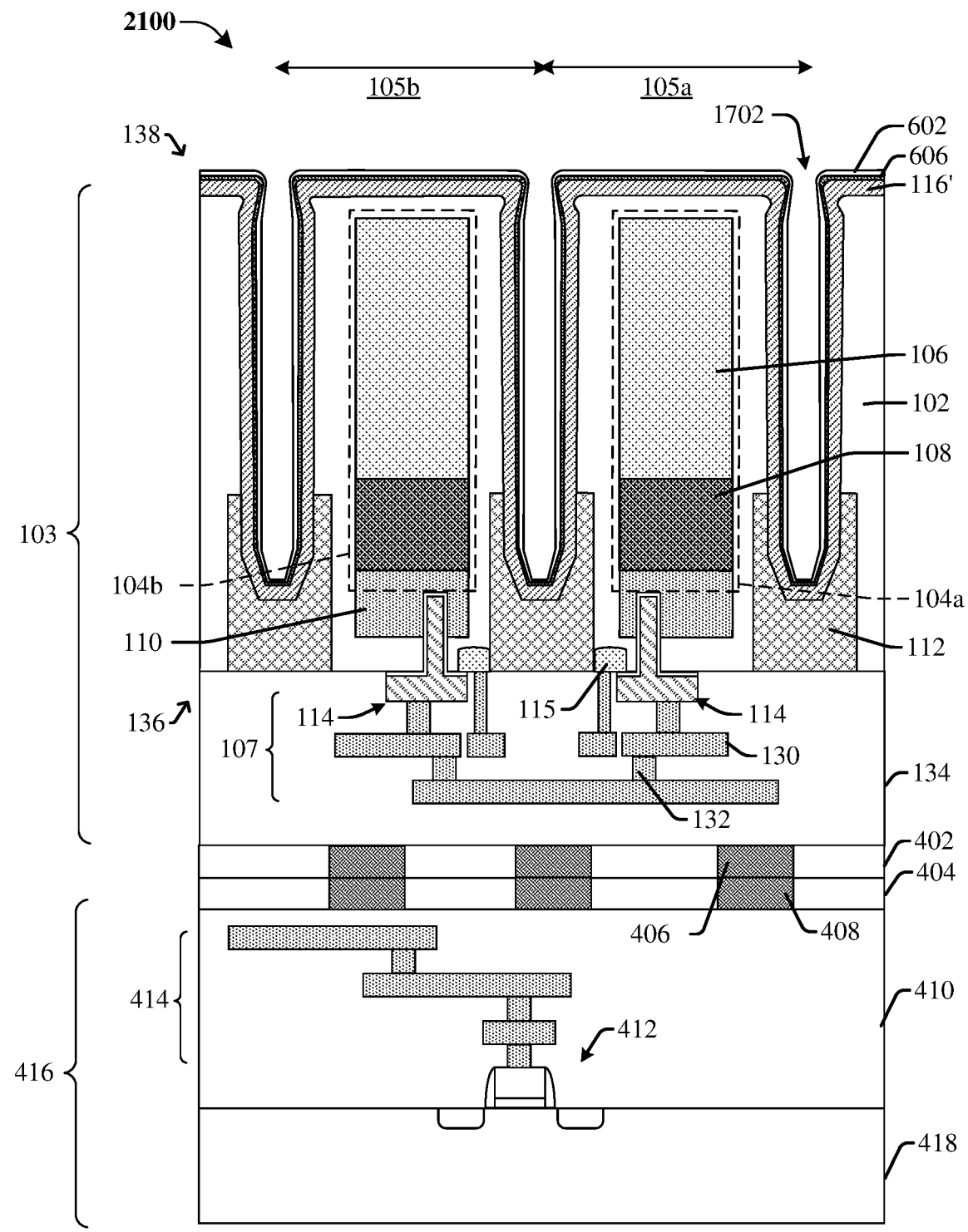

As illustrated by cross-sectional view 2100 of FIG. 21, in some embodiments, a diffusion enhancement layer 602 is formed within the deep trenches 1702 and over the insulating layer 606. In some embodiments, the diffusion enhancement layer 602 has the second doping type. The diffusion enhancement layer 602 promotes dopant diffusion into the substrate 102 during the subsequently performed dopant activation process. The diffusion enhancement layer 602 may be formed by, for example, the epitaxial growth process described in FIG. 19. In some embodiments, the diffusion enhancement layer 602 may have a same thickness as the isolation epitaxial precursor 116'. In some embodiments, the diffusion enhancement layer 602 may be or comprise, for example amorphous silicon or some other suitable material(s).

Figure 22A:
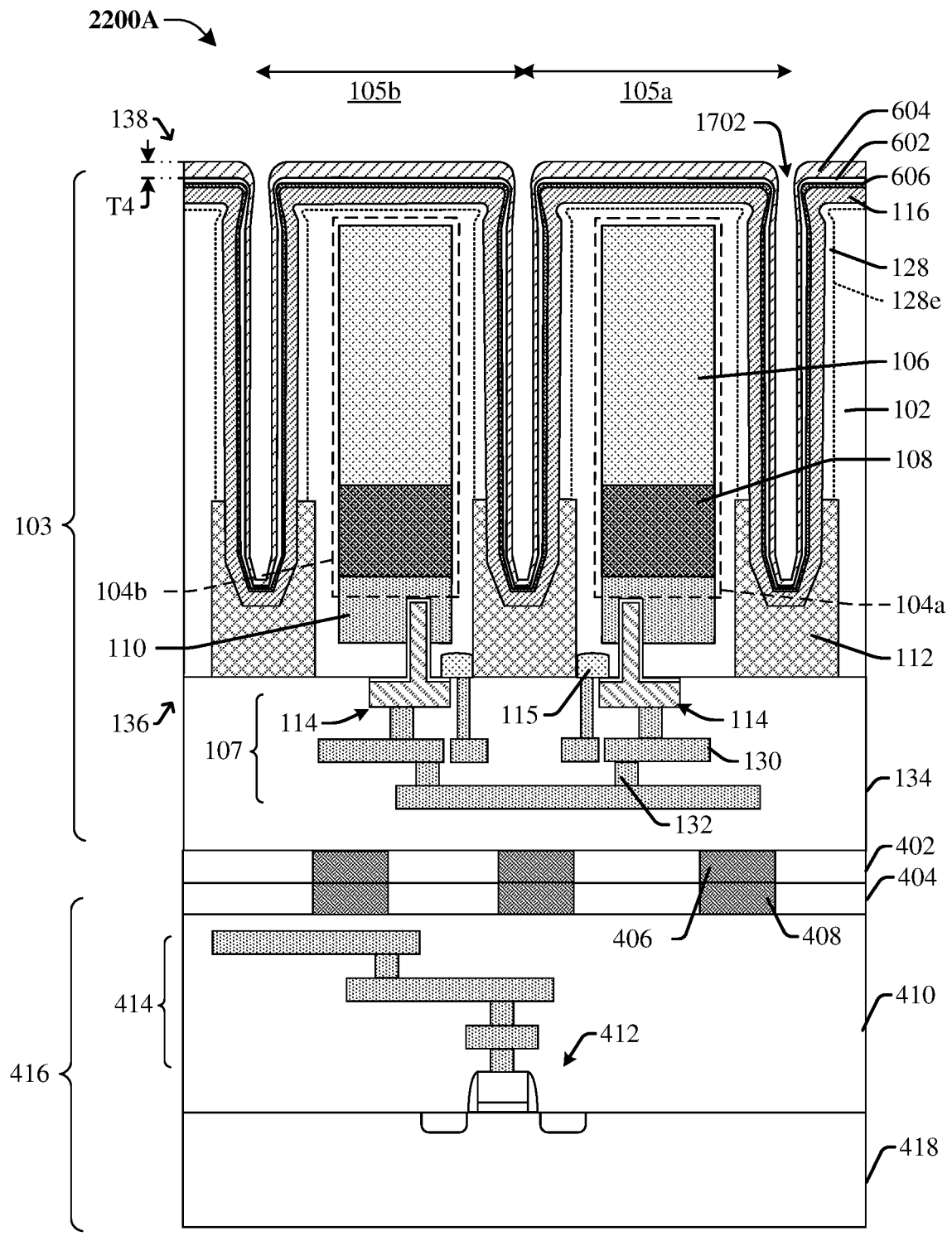

As illustrated by cross-sectional view 2200A of FIG. 22A, in some embodiments, a light absorbing layer 604 is formed within the deep trenches 1702 and along inner sidewalls of the diffusion enhancement layer 602. In some embodiments, the light absorbing layer 604 may be formed by an epitaxial growth process, or some other suitable formation process. Within the deep trenches 1702, inner sidewalls of the light absorbing layer 604 face one another.

The light absorbing layer 604 has a fourth thickness T4 directly over the image sensing elements 104a, 104b. In some embodiments, the light absorbing layer 604 has a thickness along inner sidewalls of the diffusion enhancement layer 602 that is less than the fourth thickness T4. In some embodiments, the fourth thickness T4 may range from approximately 50 nanometers to approximately 100 nanometers, approximately 50 nanometers to approximately 64 nanometers, approximately 64 nanometers to approximately 80 nanometers, or some other suitable value. If the fourth thickness T4 is too large (e.g., greater than approximately 100 nanometers), the light absorbing layer 604 will not promote diffusion of dopants from the doped isolation layer 116 into the substrate 102. If the fourth thickness T4 is too small (e.g., less than approximately 50 nanometers), the light absorbing layer 604 will not protect the device from imperfections, leading to performance issues.

A dopant activation process is then performed on the device to facilitate diffusion and to form a doped isolation layer 116 and a dopant diffusion region 128 extending from the doped isolation layer 116 to an outer edge 128e. In some embodiments, the dopant activation process comprises or is a dynamic surface anneal process, or some other similar anneal process. As an example, the dopant activation process may use a laser (e.g., a green laser (wavelength-532 nm), a UV laser (wavelength-308 nm), a near IR laser (wavelength-810 nm), or the like) that correspondingly heats portions of the device to a temperature of greater than approximately 900 degrees Celsius for a time in a range between approximately 100 nanoseconds and approximately 200 microseconds per cycle for approximately 8 cycles. The dopant activation process is beneficial to low thermal budget products, especially compared to other approaches such as a deposition process followed by a thermal drive-in process, which either can't provide enough junction depth or not acceptable for low thermal budget product because of the high temperature junction drive-in and anneal for damage recovery and dopant activation.

The light absorbing layer 604 absorbs light from the dopant activation process and heats up. In doing so, the light absorbing layer decreases the penetration depth of the light, preventing the induction of imperfections in the device at high annealing temperatures (e.g., greater than approximately 900 degrees Celsius). Further, by heating up, the light absorbing layer 604 provides tensile stress to the doped isolation layer 116, which promotes diffusion of dopants from the doped isolation layer 116 into the substrate 102. Hence, dopants are diffused into the substrate a sufficient distance to at least maintain the full well capacity, the number of white pixels, and/or the dark current above acceptable values without impairing device performance. In some embodiments, the light absorbing layer 604 may be or comprise a light absorbing material such as, for example, amorphous germanium, an amorphous silicon-germanium alloy with a germanium percentage ranging from approximately 16 percent to approximately 80 percent, approximately 30 percent to approximately 80 percent, or some other suitable value, titanium nitride, aluminum oxide, or some other suitable light absorbing material(s). In some embodiments, the light absorbing material has an absorption coefficient of greater than approximately $10^4$ centimeters$^{-1}$, approximately $6 \times 10^4$ centimeters$^{-1}$, approximately $10^5$ centimeters$^{-1}$, or some other suitable value. In some embodiments, if the absorption coefficient of the light absorbing material is too low (e.g., less than approximately $10^4$ centimeters$^{-1}$), the penetration depth of the light may not be sufficiently decreased, such that the induction of imperfections in the device may not be prevented at high annealing temperatures. In some embodiments, the dopant activation process may diffuse light absorbing material from the light absorbing layer 604 into the substrate 102. As a consequence of this, amorphous germanium or an amorphous silicon-germanium alloy are preferable to titanium nitride or aluminum oxide to prevent metal contamination. Further, amorphous germanium or an amorphous silicon-germanium alloy have a higher absorption coefficient than titanium nitride or aluminum oxide.

Figure 22B:
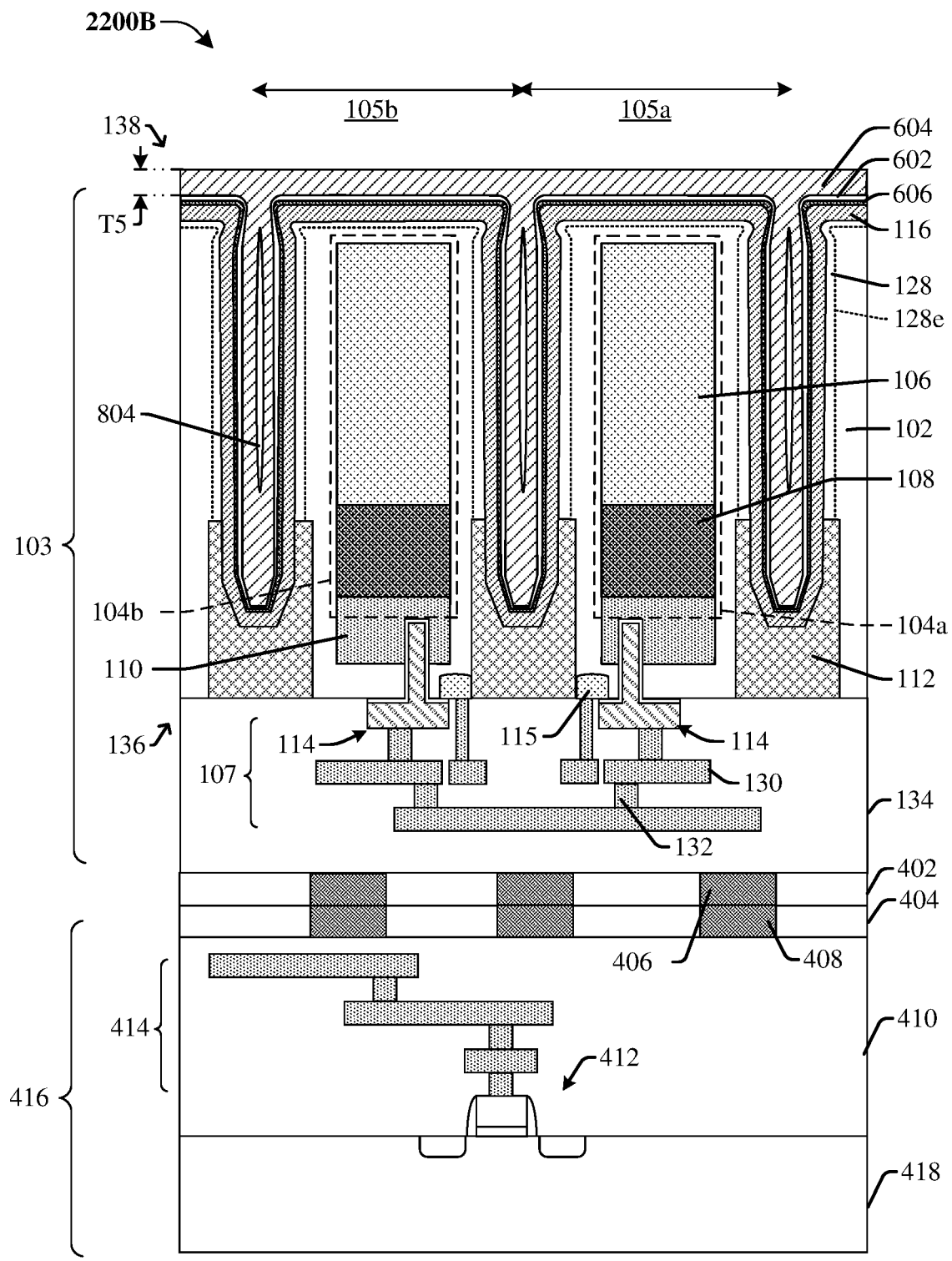

As illustrated by cross-sectional view 2200B of FIG. 22B, in some embodiments, a light absorbing layer 604 is formed over the diffusion enhancement layer 602 and within the deep trenches 1702 to fill the space between inner sidewalls of the diffusion enhancement layer 602. Thus, FIG. 22B is an alternative process stage to FIG. 22A, and follows from FIG. 21. In some embodiments, the light absorbing layer 604 may be formed by an epitaxial growth process, or some other suitable formation process. In some embodiments, the light absorbing layer 604 comprises a void or air gap 804. In some of such embodiments, the light absorbing layer 604 and the void or air gap 804 entirely fill the remaining space of the deep trench.

The light absorbing layer 604 has a fifth thickness T5 directly over the image sensing elements 104a, 104b. In some embodiments, the light absorbing layer 604 has a thickness along inner sidewalls of the diffusion enhancement layer 602 that is less than the fifth thickness T5. In some embodiments, the fifth thickness T5 may range from approximately 150 nanometers to approximately 200 nanometers, approximately 150 nanometers to approximately 180 nanometers, approximately 180 nanometers to approximately 200 nanometers, or some other suitable value. If the fifth thickness T5 is too large (e.g., greater than approximately 200 nanometers), the light absorbing layer 604 will not promote diffusion of dopants from the doped isolation layer 116 into the substrate 102. If the fifth thickness T5 is too small (e.g., less than approximately 150 nanometers), the light absorbing layer 604 will not protect the device from imperfections, leading to performance issues.

A dopant activation process is then performed on the device to facilitate diffusion and to form a doped isolation layer 116 and a dopant diffusion region 128. In some embodiments, the dopant activation process comprises or is a dynamic surface anneal process, or some other similar anneal process. As an example, the dopant activation process may use a laser (e.g., a green laser) that correspondingly heats portions of the device to a temperature of greater than approximately 900 degrees Celsius for a time in a range between approximately 100 nanoseconds and approximately 200 microseconds per cycle for approximately 8 cycles.

The light absorbing layer 604 absorbs light from the dopant activation process and heats up. In doing so, the light absorbing layer decreases the penetration depth of the light, preventing the induction of imperfections in the device at high annealing temperatures (e.g., greater than approximately 900 degrees Celsius). Further, by heating up, the light absorbing layer 604 provides tensile stress to the doped isolation layer 116, which promotes diffusion of dopants from the doped isolation layer 116 into the substrate 102. Hence, dopants are diffused into the substrate a sufficient distance to at least maintain the full well capacity, the number of white pixels, and/or the dark current above acceptable values without impairing device performance. In some embodiments, the light absorbing layer 604 may be or comprise a light absorbing material such as, for example, germanium, a silicon-germanium alloy with a germanium percentage ranging from approximately 16 percent to approximately 80 percent, approximately 30 percent to approximately 80 percent, or some other suitable value, titanium nitride, aluminum oxide, or some other suitable light absorbing material(s). In some embodiments, the dopant activation process may diffuse light absorbing material from the light absorbing layer 604 into the substrate 102. As a consequence of this, germanium or a silicon-germanium alloy are preferable to titanium nitride or aluminum oxide to prevent metal contamination. Further, germanium or a silicon-germanium alloy have a higher absorption coefficient than titanium nitride or aluminum oxide.

Proceeding from FIGS. 22A-22B, in some embodiments, an IC comprising a substrate having a dopant diffusion region extending from a DTI structure into the substrate may be formed as described hereafter. In some embodiments, the acts described hereafter with regard to FIGS. 23A-23E are performed following from either FIG. 22A or FIG. 22B, and the acts described hereafter with regard to FIGS. 24A-24D and FIGS. 25A-25D are skipped, to form the IC. The IC may, for example, be as described with regard to FIG. 4. In some embodiments, the acts described hereafter with regard to FIGS. 24A-24D are performed following from FIG. 22A, and the acts described hereafter with regard to FIGS. 23A-23E and FIGS. 25A-25D are skipped, to form an alternative embodiment of the IC in which the DTI structure comprises a light absorbing layer disposed along sidewalls of an isolation filler structure. The image sensing die of the IC may, for example, be as described with regard to the image sensing die 103 of FIG. 6. In some embodiments, the acts described hereafter with regard to FIGS. 25A-25D are performed following from FIG. 22B, and the acts described hereafter with regard to FIGS. 23A-23E and FIGS. 24A-24D are skipped, to form an alternative embodiment of the IC in which the DTI structure comprises a light absorbing layer entirely below an overlying isolation structure. The image sensing die of the IC may, for example, be as described with regard to the image sensing die 103 of FIG. 8.

Figure 23A:
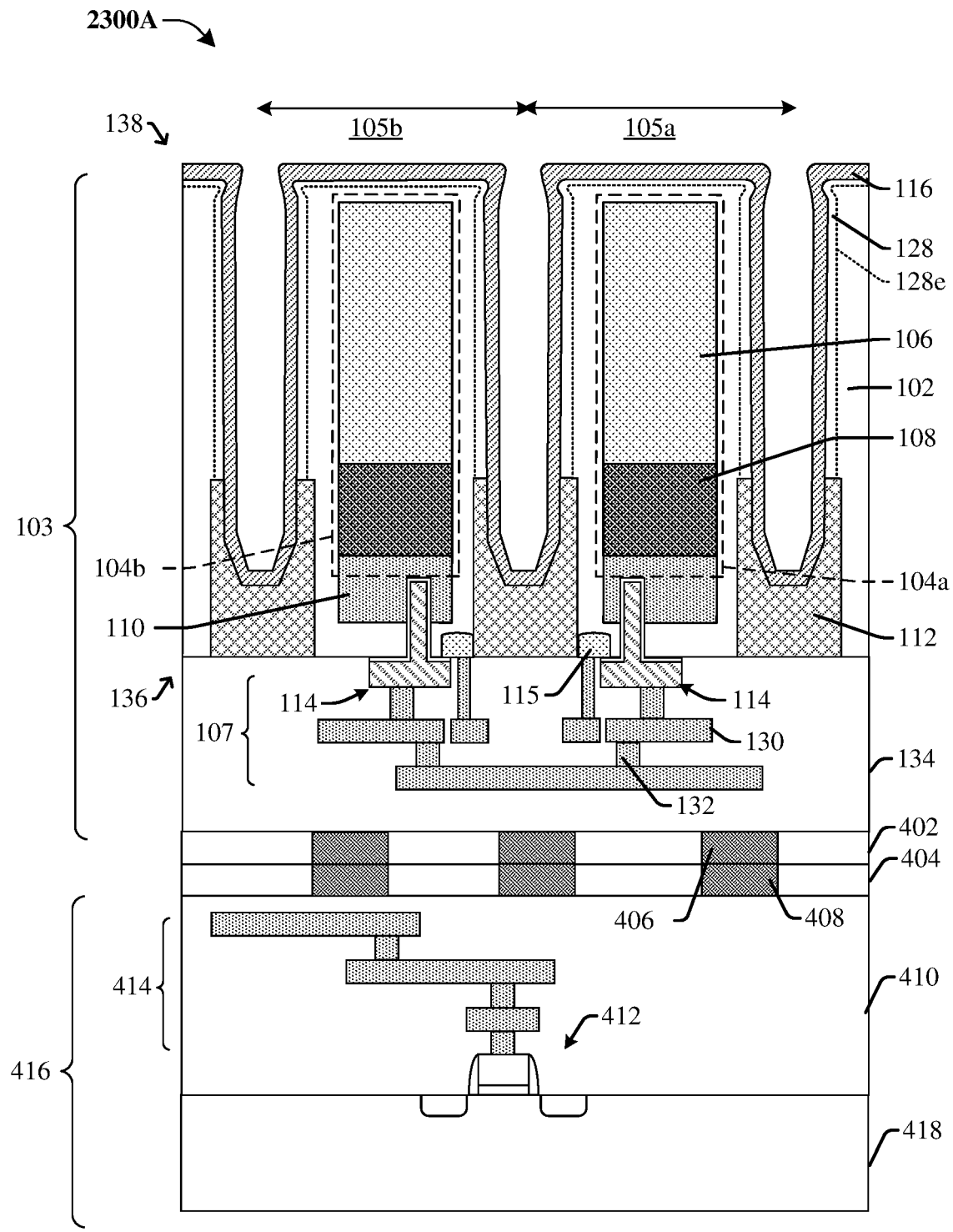

As illustrated by the cross-sectional view 2300A of FIG. 23A, in some embodiments, a removal process is performed to remove the light absorbing layer 604, the diffusion enhancement layer 602, and the insulating layer 606. The removal process exposes the upper surface and the inner sidewalls of the doped isolation layer 116. In some embodiments, the removal process may be or comprise an ozone clean, SC1 (a mixture of NH$_4$OH and H$_2$O$_2$), or some other suitable removal process.

In alternative embodiments in which the insulating layer 606 is omitted, the dopant activation process may form dislocations in a portion of the doped isolation layer 116. In some of such embodiments, the removal process may further comprise an etching process to remove the dislocated portion of the doped isolation layer 116. In some embodiments, the etching process may be or comprise, for example, tetramethylammonium hydroxide (TMAH) wet etching, hydrofluoric acid (HF) wet etching, or some other suitable etching process.

Figure 23B:
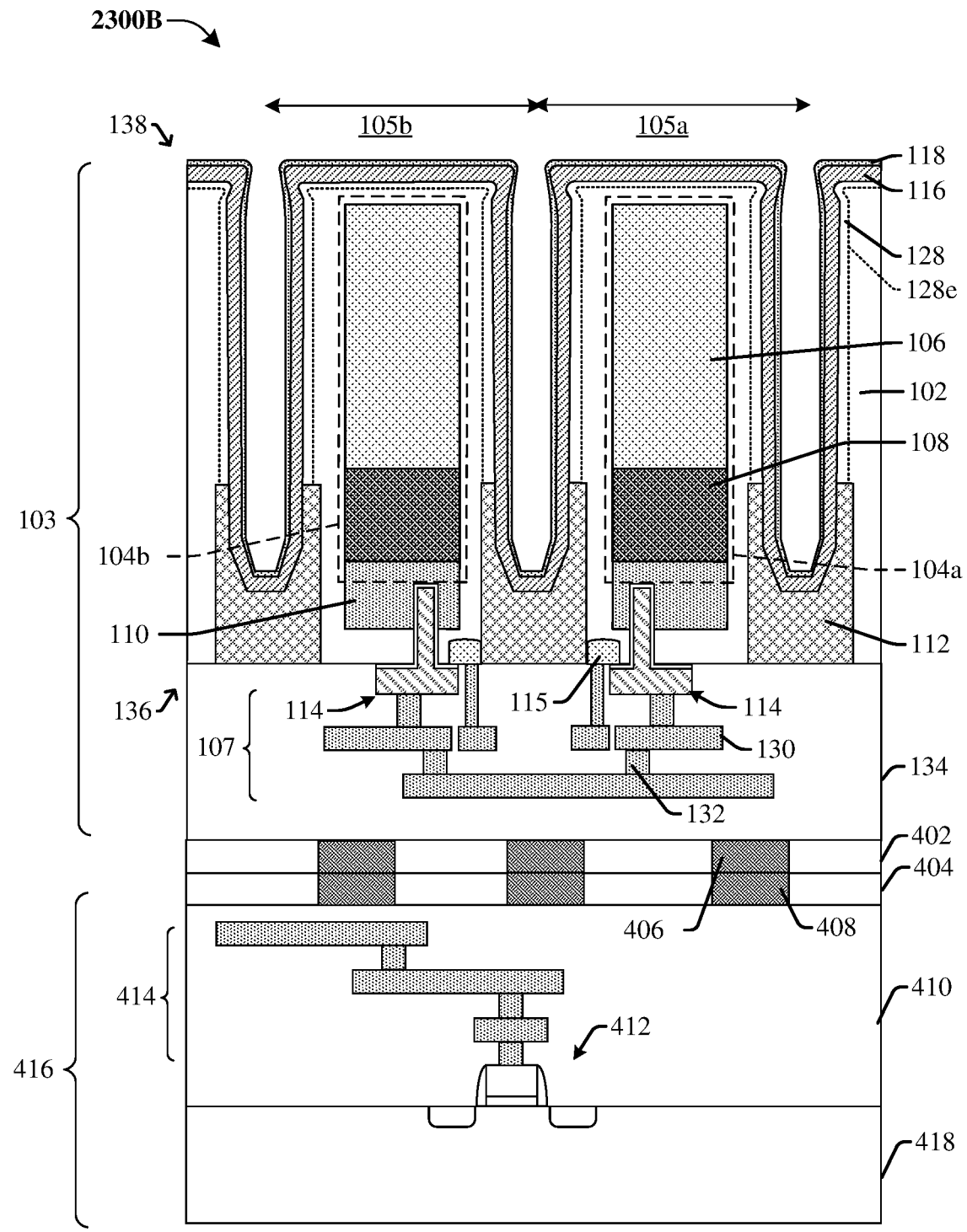
Figure 23C:
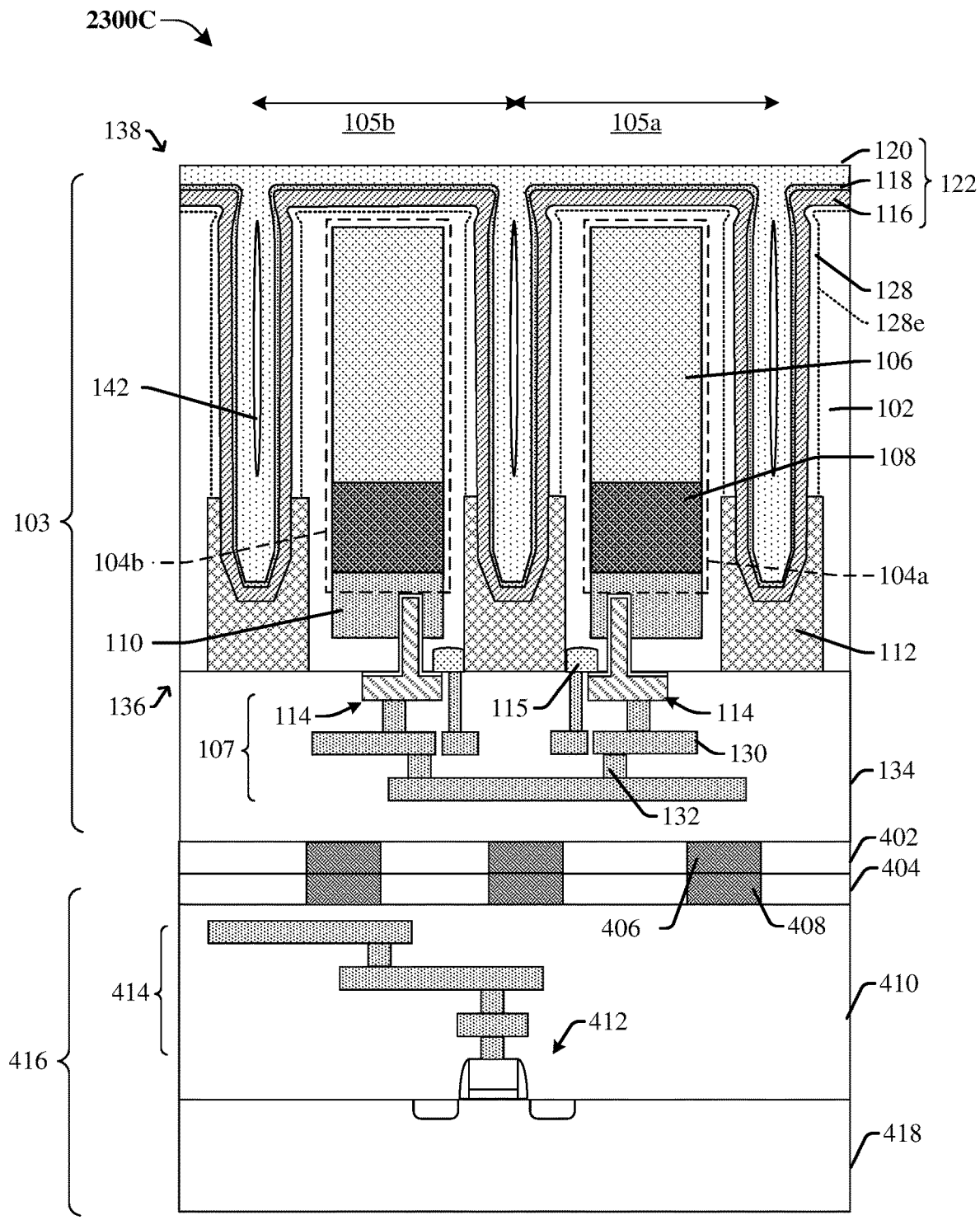

As illustrated by the cross-sectional view 2300B of FIG. 23B, in some embodiments, a high-k dielectric layer 118 is formed over the doped isolation layer 116 and along the inner sidewalls of the doped isolation layer 116. In some embodiments, high-k dielectric layer 118 is formed directly on and contacting the doped isolation layer 116. In some embodiments, the high-k dielectric layer 118 may be deposited using a physical vapor deposition technique or a chemical vapor deposition technique. In embodiments in which the doped isolation layer 116 has a sufficient thickness, the high-k dielectric layer 118 may be omitted. In further embodiments, the sufficient thickness may be a second thickness T2 ranging from approximately 10 nanometers to approximately 15 nanometers, from approximately 10 nanometers to approximately 12 nanometers, from approximately 12 nanometers to approximately 15 nanometers, or some other suitable value, As illustrated by cross-sectional view 2300C of FIG. 23C, in some embodiments, an isolation filler structure 120 is formed to fill the space between inner sidewalls of the high-k dielectric layer 118. In some embodiments, the isolation filler structure 120 comprises a void or air gap 142. In some of such embodiments, the isolation filler structure 120 and the void or air gap 142 entirely fill the remaining space of the deep trench. In some embodiments, a planarization process is performed after forming the isolation filler structure 120 to form a planar surface that extends along an upper surface of the high-k dielectric layer 118. In some alternative embodiments, the doped isolation layer 116, the high-k dielectric layer 118, and the isolation filler structure 120 may be subject to a planarization process that removes lateral portions of the isolation filler structure 120 the high-k dielectric layer 118, and doped isolation layer 116 directly overlying pixel regions 105a, 105b. In some embodiments, the isolation filler structure 120 may be deposited using a physical vapor deposition technique or a chemical vapor deposition technique. As a result, the DTI structure 122 is formed in the image sensing die 103, extending from the backside 138 of the substrate 102 to a position within the plurality of isolation wells 112. The DTI structure 122 is formed between and isolate adjacent pixel regions 105a, 105b.

Figure 23D:
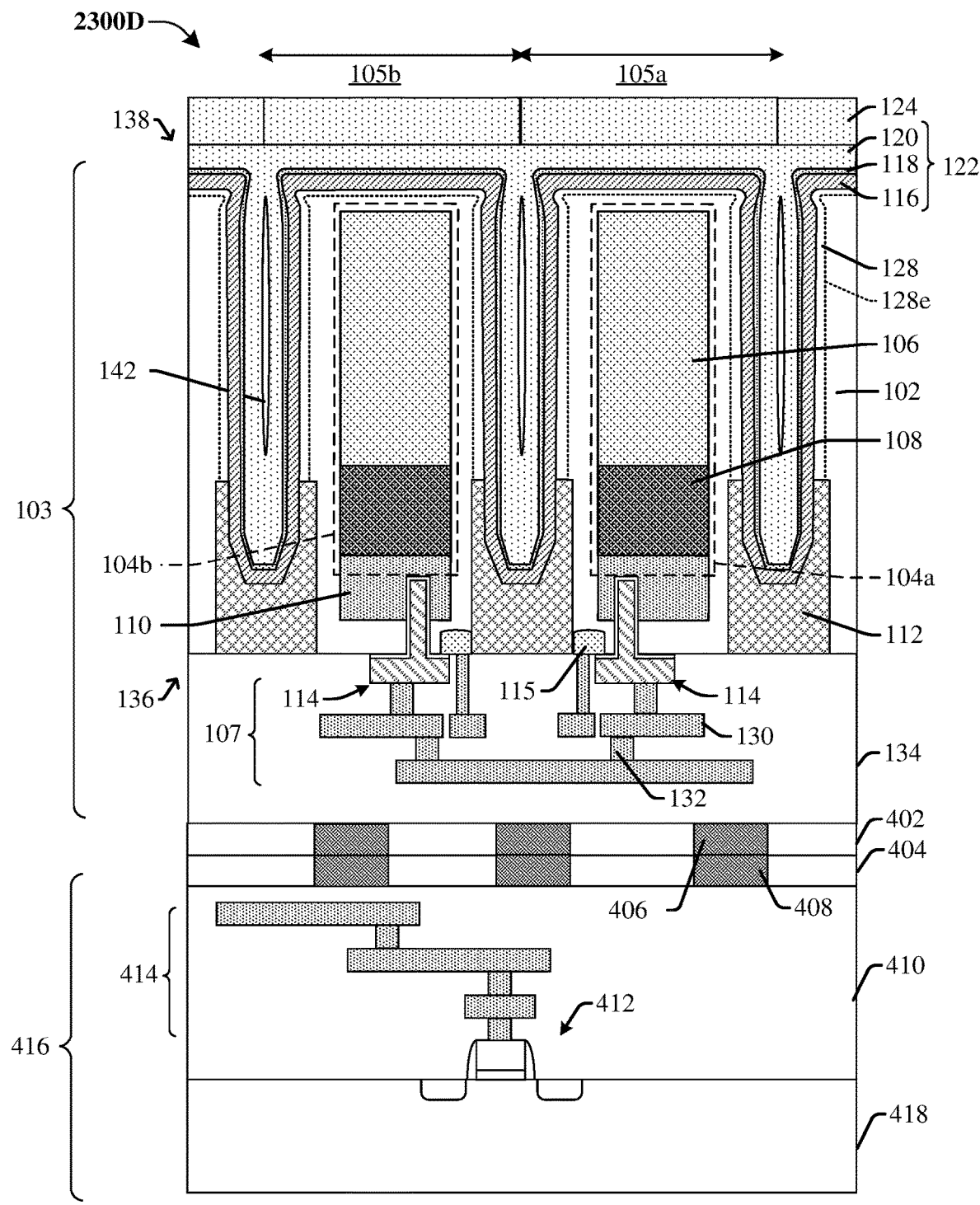

As illustrated by cross-sectional view 2300D of FIG. 23D, in some embodiments, color filters 124 corresponding to pixel sensors are formed over corresponding pixel regions 105a, 105b. The color filters 124 are formed of a material that allows light of the corresponding color to pass therethrough, while blocking light of other colors. Further, the color filters 124 may be formed with assigned colors. For example, the color filters 124 are alternatingly formed with assigned colors of red, green, and blue. The color filters 124 may be symmetrical about vertical axes aligned with a center of the image sensing elements 104a, 104b of the corresponding pixel sensors. The process for forming the color filters 124 may include, for each of the different colors of the color assignments, forming a color filter layer and patterning the color filter layer. The color filter layer may be planarized subsequent to formation. The patterning may be performed by forming a photoresist layer with a pattern over the color filter layer, applying an etchant to the color filter layer according to the pattern of the photoresist layer, and removing the pattern photoresist layer.

Figure 23E:
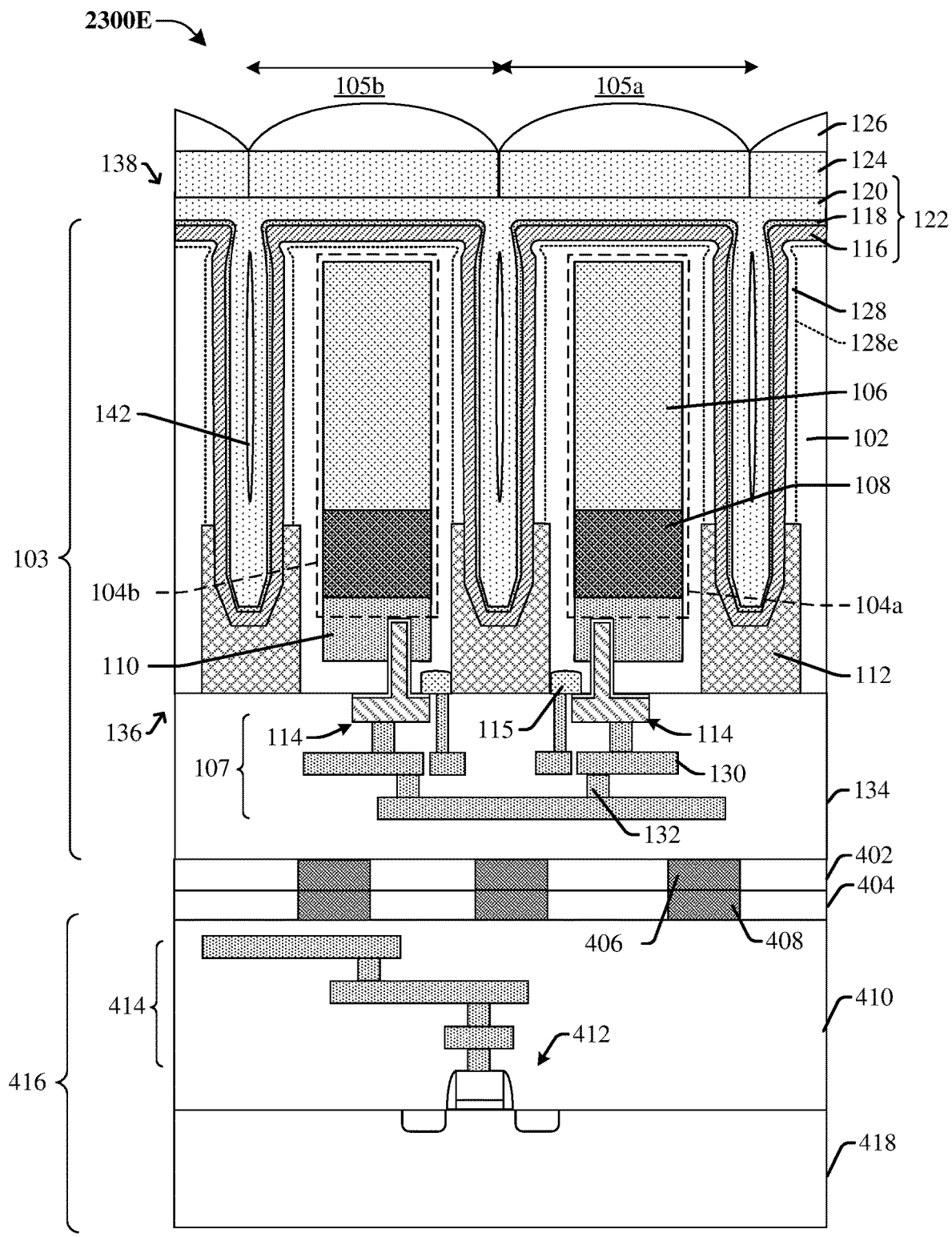

As illustrated by cross-sectional view 2300E of FIG. 23E, in some embodiments, a plurality of micro-lenses 126 corresponding to the pixel regions is formed over the color filters 124 of the corresponding pixel regions. In some embodiments, the plurality of micro-lenses 126 may be formed by depositing a micro-lens material above the plurality of color filters (e.g., by a spin-on method or a deposition process). A micro-lens template having a curved upper surface is patterned above the micro-lens material. In some embodiments, the micro-lens template may comprise a photoresist material exposed using a distributing exposing light dose (e.g., for a negative photoresist, more light is exposed at a bottom of the curvature and less light is exposed at a top of the curvature), developed and baked to form a rounding shape. The micro-lenses 126 are then formed by selectively etching the micro-lens material according to the micro-lens template.

Figure 24A:
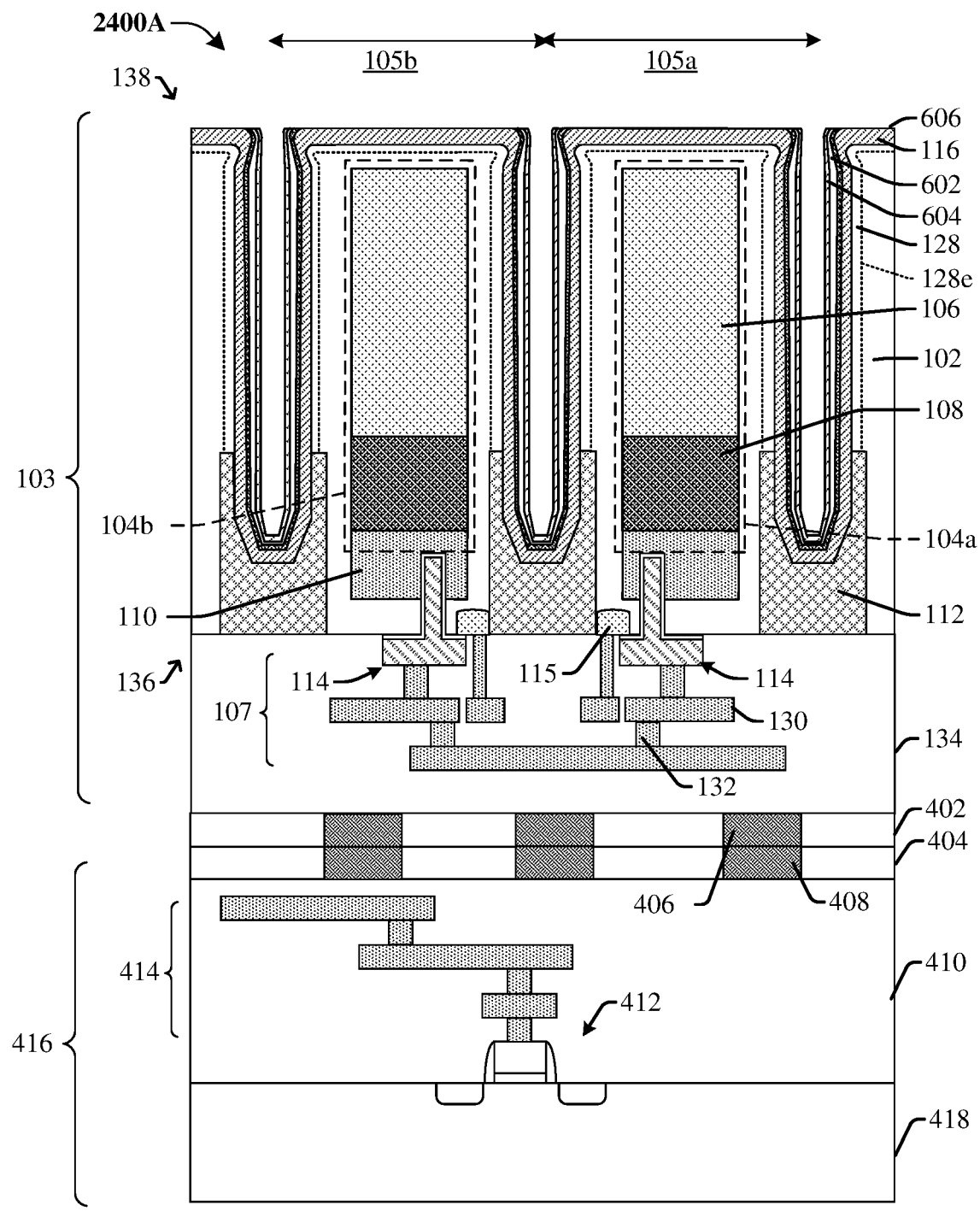

As illustrated by the cross-sectional view 2400A of FIG. 24A, in some embodiments, a planarization process is performed to remove laterally extending portions of the diffusion enhancement layer 602, the light absorbing layer 604, and the insulating layer 606 that directly overlie the substrate 102. The planarization process aligns top surfaces of the doped isolation layer 116, the diffusion enhancement layer 602, the light absorbing layer 604, and the insulating layer 606. In some embodiments, the planarization process may be or comprise, for example, grinding, chemical-mechanical planarization, or some other suitable planarization process.

Figure 24B:
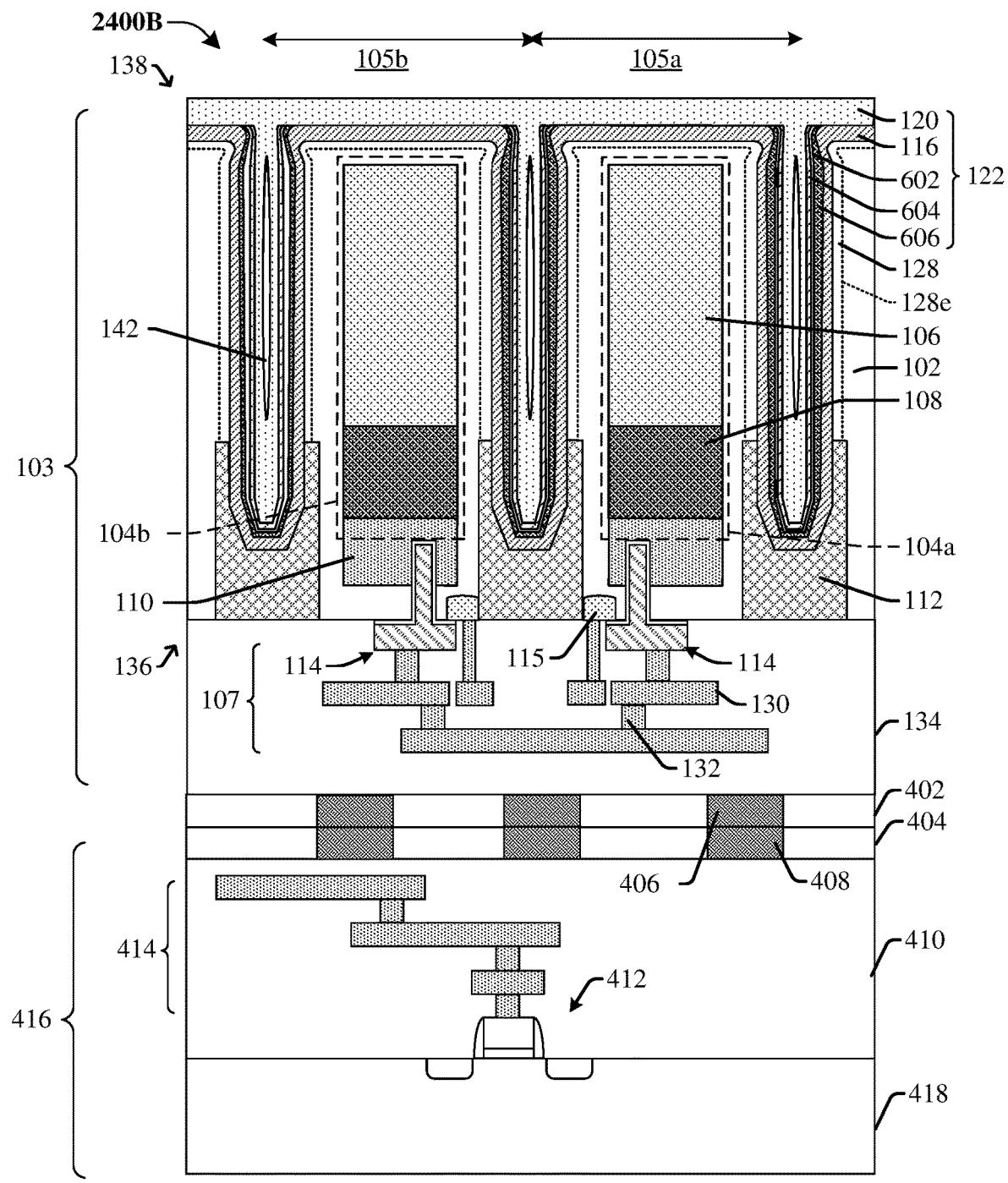

As illustrated by the cross-sectional view 2400B of FIG. 24B, in some embodiments, an isolation filler structure 120 is formed to fill the space between inner sidewalls of light absorbing layer 604. In some embodiments, the isolation filler structure 120 may be deposited using a physical vapor deposition technique or a chemical vapor deposition technique. As a result, the DTI structure 122 comprising the isolation filler structure 120, the doped isolation layer 116, the diffusion enhancement layer 602, the light absorbing layer 604, and the insulating layer 606 is formed in the image sensing die 103, extending from the backside 138 of the substrate 102 to a position within the plurality of isolation wells 112. The DTI structure 122 is formed between and isolate adjacent pixel regions 105a, 105b.

Figure 24C:
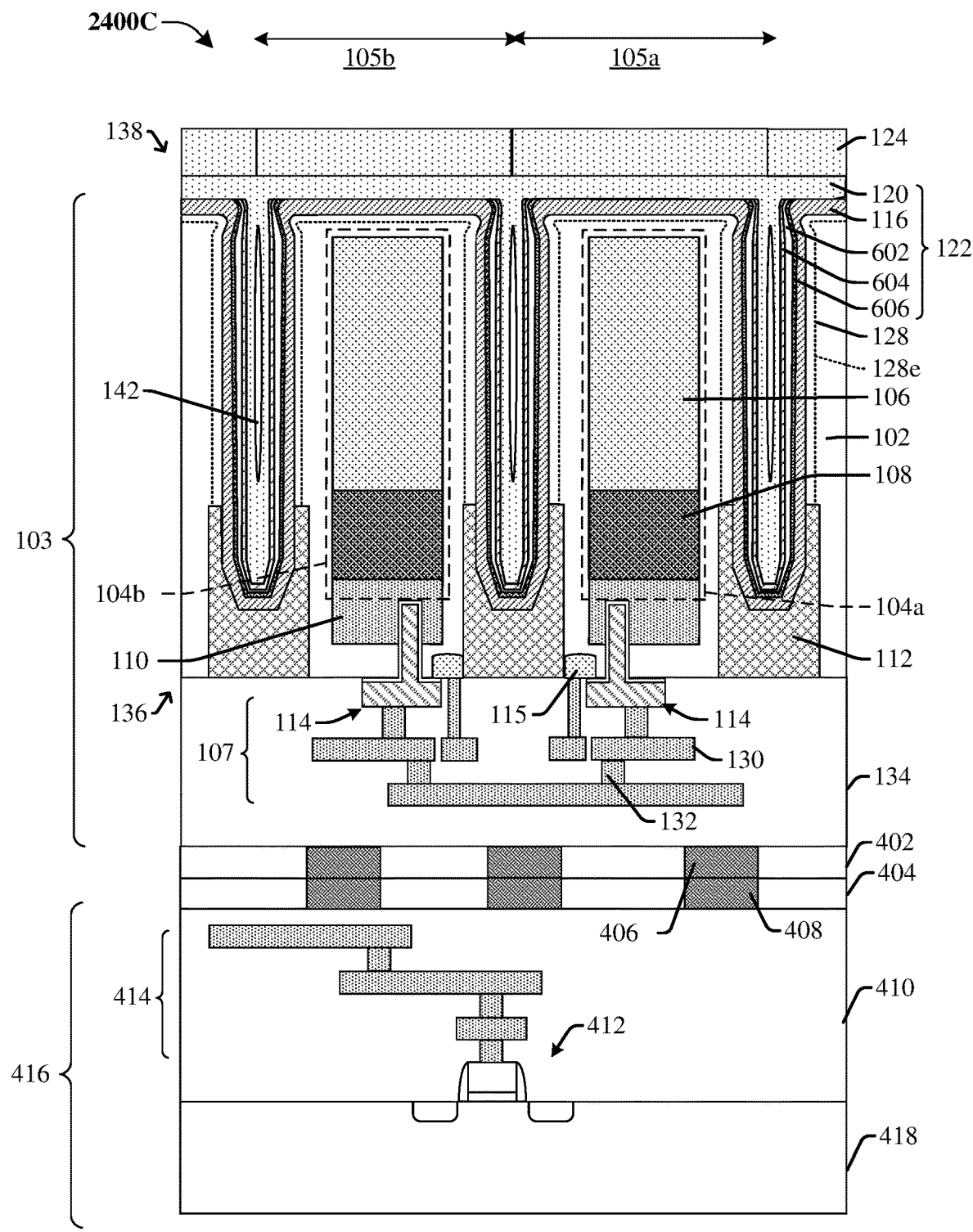

As illustrated by cross-sectional view 2400C of FIG. 24C, in some embodiments, color filters 124 corresponding to pixel sensors are formed over corresponding pixel regions 105a, 105b. In some embodiments, the color filters 124 may be formed as described with respect to FIG. 23D.

Figure 24D:
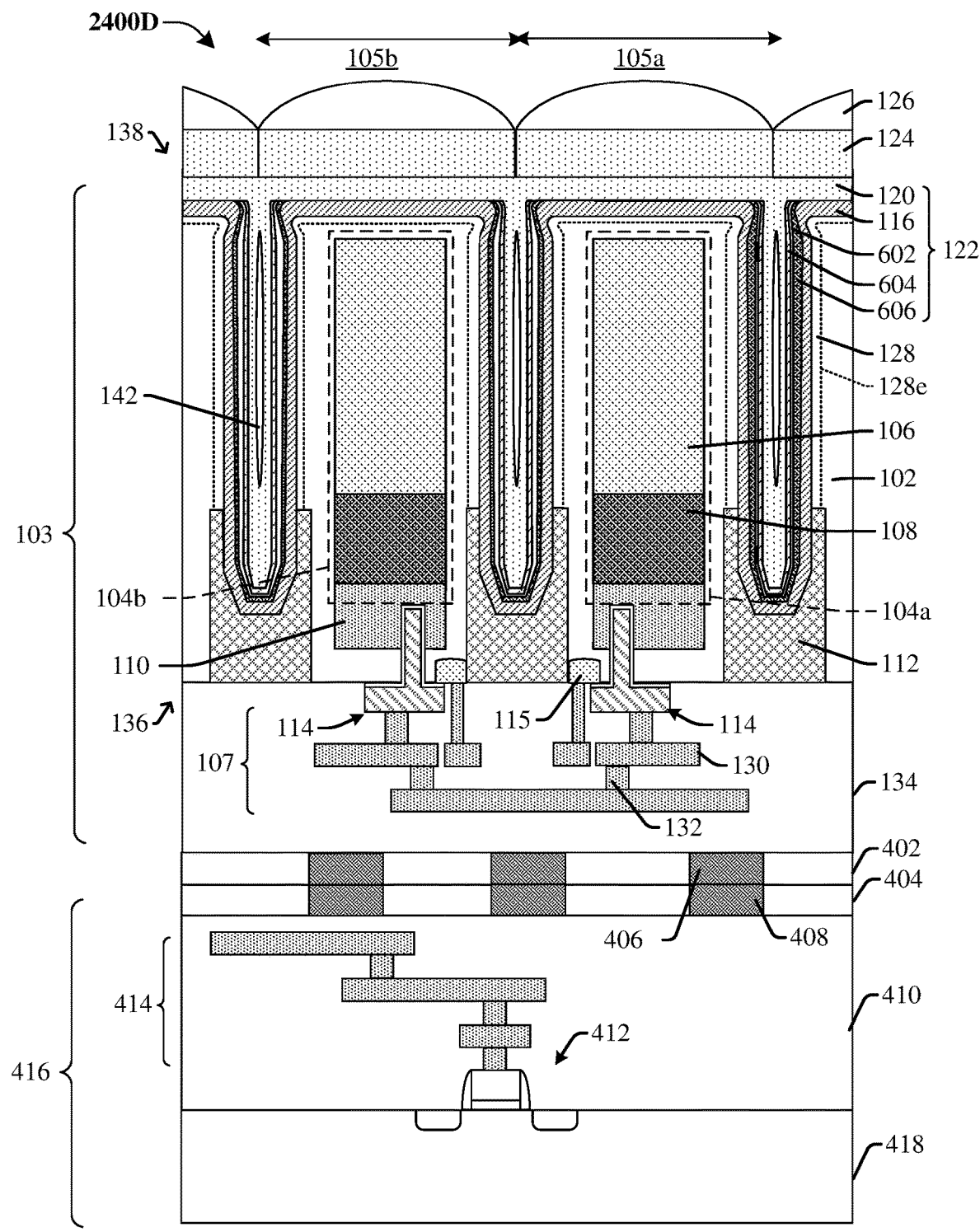

As illustrated by cross-sectional view 2400D of FIG. 24D, in some embodiments, a plurality of micro-lenses 126 corresponding to the pixel regions is formed over the color filters 124 of the corresponding pixel regions. In some embodiments, the plurality of micro-lenses 126 may be formed as described with respect to FIG. 23D.

Figure 25A:
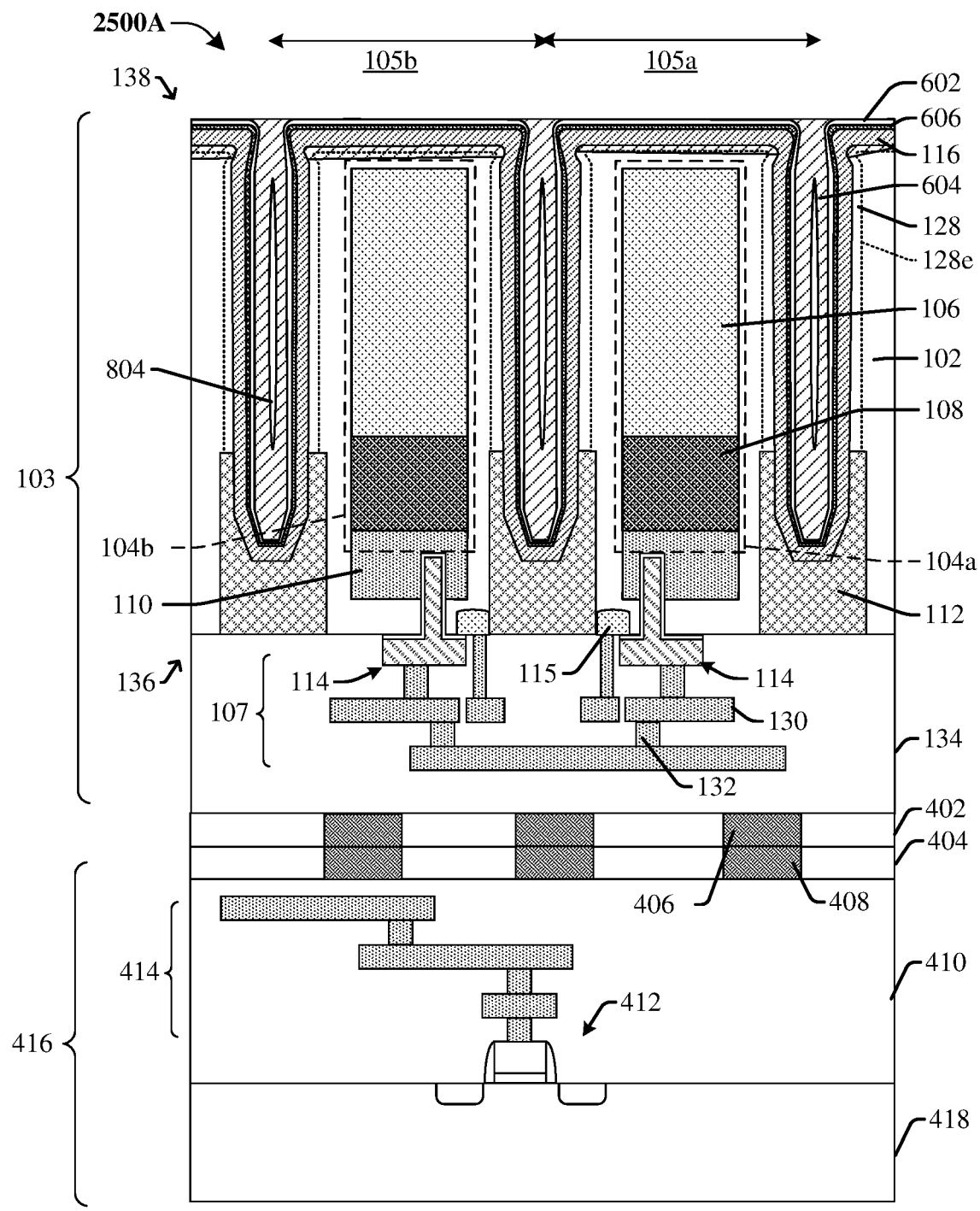

As illustrated by the cross-sectional view 2500A of FIG. 25A, in some embodiments, a planarization process is performed to remove laterally extending portions of the diffusion enhancement layer 602, the light absorbing layer 604, and the insulating layer 606 that directly overlie the substrate 102. The planarization process aligns top surfaces of the doped isolation layer 116, the diffusion enhancement layer 602, the light absorbing layer 604, and the insulating layer 606. In some embodiments, the planarization process may be or comprise, for example, grinding, chemical-mechanical planarization, or some other suitable planarization process.

Figure 25B:
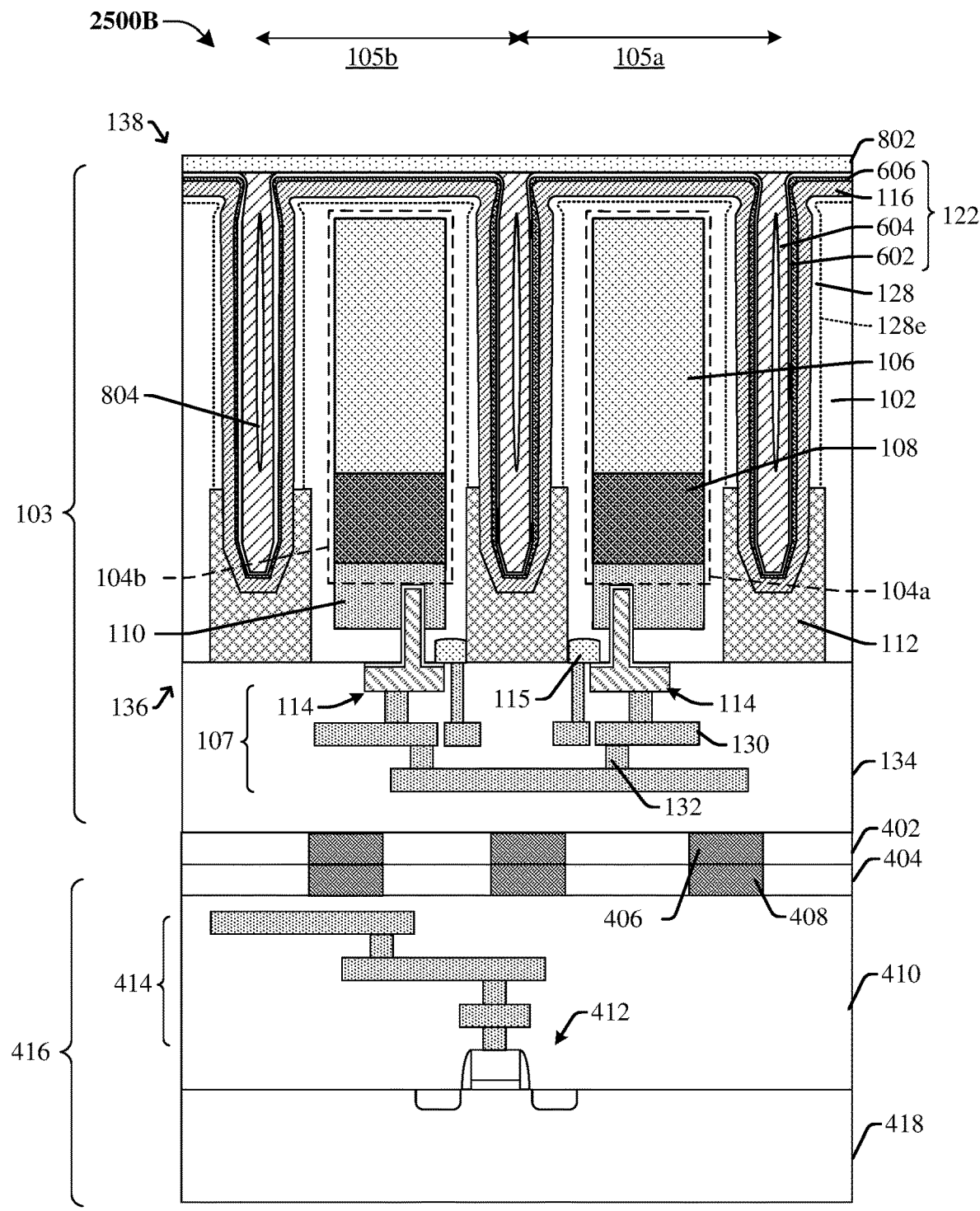

As illustrated by the cross-sectional view 2500B of FIG. 25B, in some embodiments, an overlying isolation structure 802 is formed to isolate the doped isolation layer 116 from the subsequently formed color filters. In some embodiments, the overlying isolation structure 802 may be deposited using a physical vapor deposition technique or a chemical vapor deposition technique. As a result, the DTI structure 122 comprising the doped isolation layer 116, the diffusion enhancement layer 602, the light absorbing layer 604, and the insulating layer 606 is formed in the image sensing die 103, extending from the backside 138 of the substrate 102 to a position within the plurality of isolation wells 112. The DTI structure 122 is formed between and isolate adjacent pixel regions 105a, 105b.

Figure 25C:
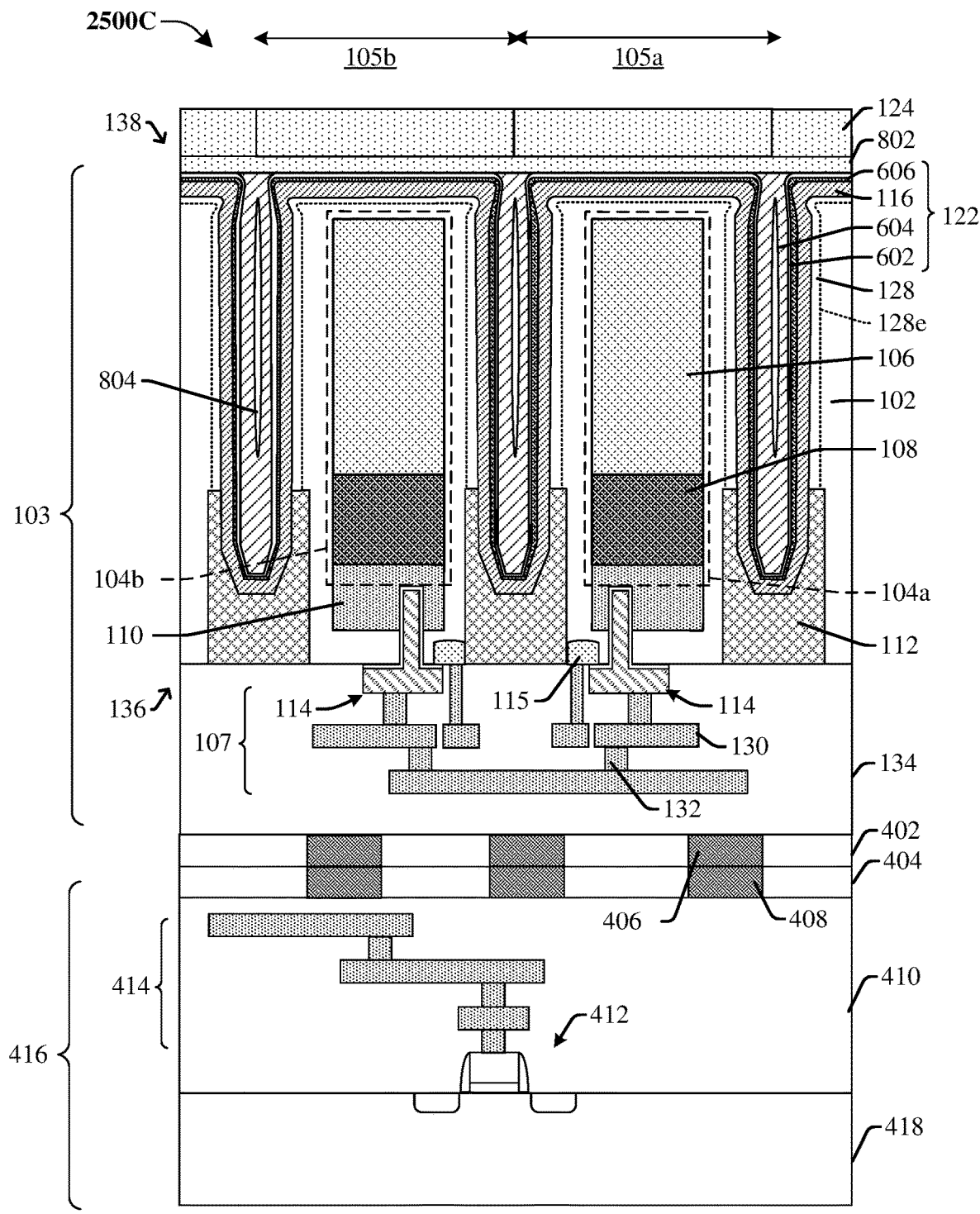

As illustrated by cross-sectional view 2500C of FIG. 25C, in some embodiments, color filters 124 corresponding to pixel sensors are formed on the overlying isolation structure 802 and over corresponding pixel regions 105a, 105b. In some embodiments, the color filters 124 may be formed as described with respect to FIG. 23D.

Figure 25D:
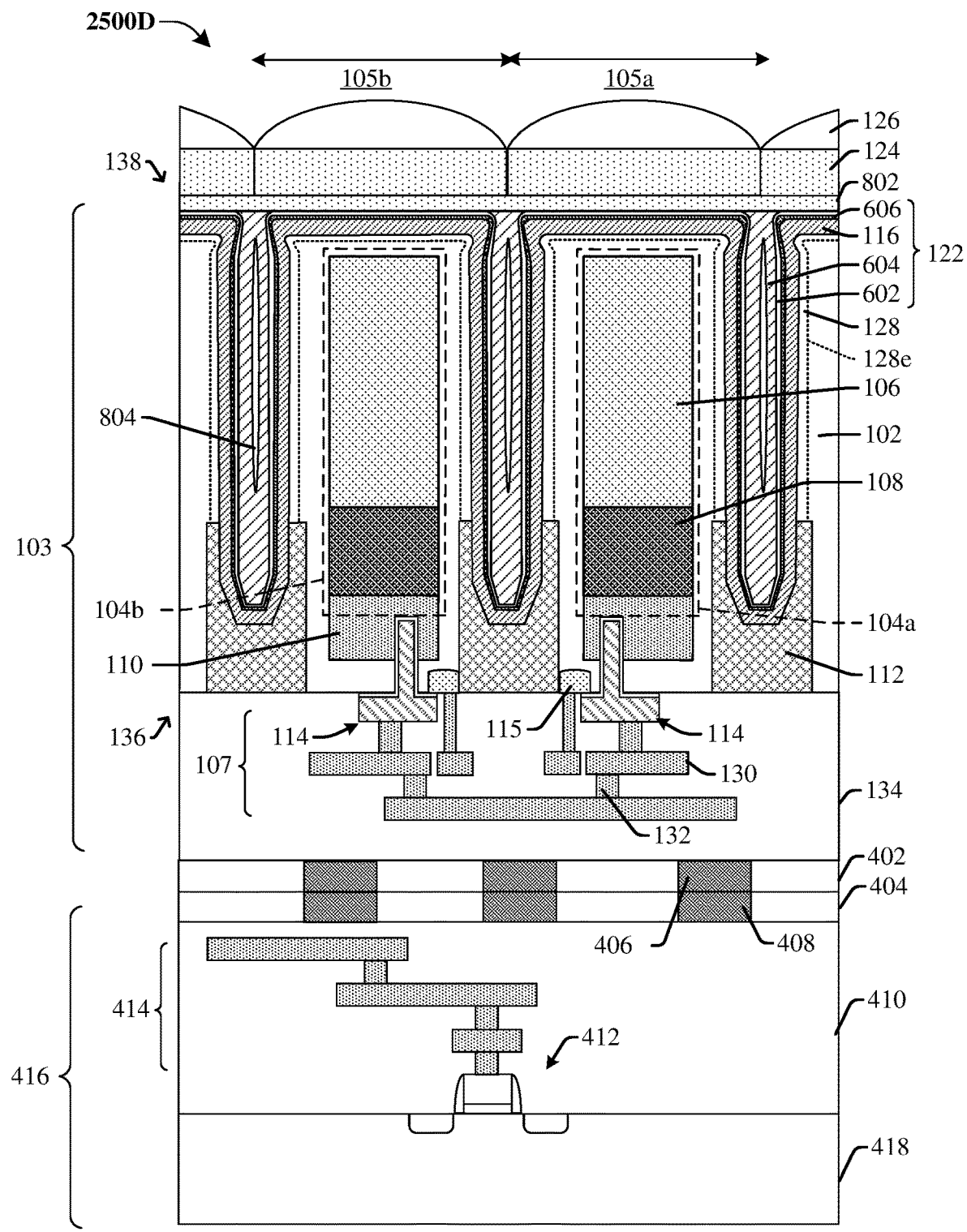

As illustrated by cross-sectional view 2500D of FIG. 25D, in some embodiments, a plurality of micro-lenses 126 corresponding to the pixel regions is formed over the color filters 124 of the corresponding pixel regions. In some embodiments, the plurality of micro-lenses 126 may be formed as described with respect to FIG. 23D.

Figure 26:
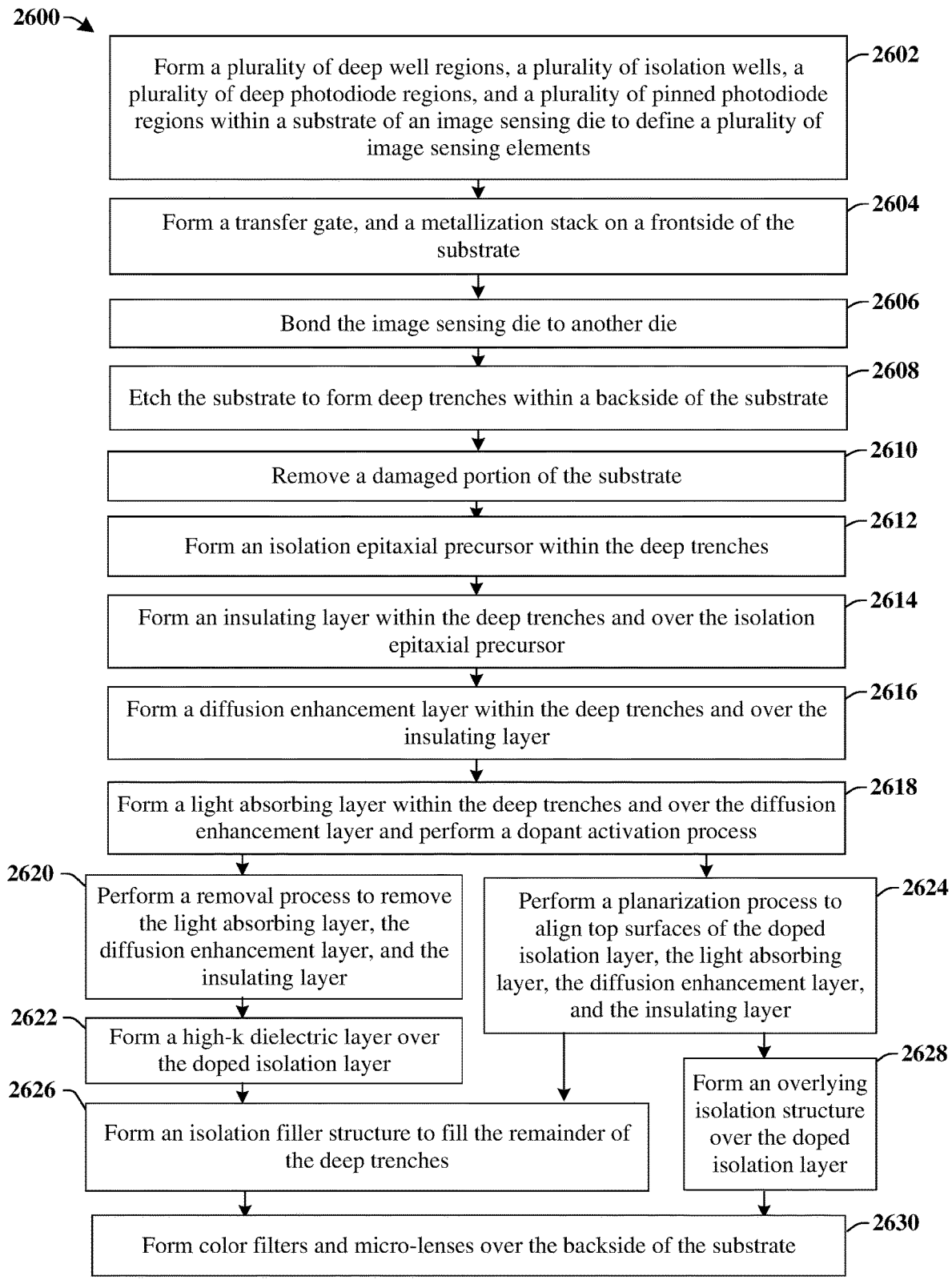
FIG. 26 illustrates a flowchart of some embodiments of a method for using a light absorbing layer to form an IC comprising a substrate having a dopant diffusion region extending from a DTI structure into the substrate.

FIG. 26 illustrates a flowchart of some embodiments of a method for using a light absorbing layer to form an IC comprising a substrate having a dopant diffusion region extending from a deep trench isolation DTI structure into the substrate.

At 2602, a plurality of deep well regions, a plurality of isolation wells, a plurality of deep photodiode regions, and a plurality of pinned photodiode regions are formed within a substrate of an image sensing die to define a plurality of image sensing elements. See, for example, FIGS. 10-13.

At 2604, a transfer gate and a metallization stack are formed on a frontside of the substrate. See, for example, FIGS. 14-15.

At 2606, the image sensing die is bonded to another die. See, for example, FIG. 16.

At 2608, the substrate is etched to form deep trenches within a backside of the substrate. See, for example, FIG. 17.

At 2610, a damaged portion of the substrate is removed. See, for example, FIG. 18.

At 2612, an isolation epitaxial precursor is formed within the deep trenches. See, for example, FIG. 19.

At 2614, an insulating layer is formed within the deep trenches and over the isolation epitaxial precursor. See, for example, FIG. 20.

At 2616, a diffusion enhancement layer is formed within the deep trenches and over the insulating layer. See, for example, FIG. 21.

At 2618, a light absorbing layer is formed within the deep trenches and over the diffusion enhancement layer and a dopant activation process is performed. See, for example, FIG. 22A or FIG. 22B.

In some embodiments, the acts at 2620, 2622, 2626, and 2630 are performed, proceeding from 2618, to form the IC. At 2620, a removal process is performed to remove the light absorbing layer, the diffusion enhancement layer, and the insulating layer. See, for example, FIG. 23A. At 2622, a high-k dielectric layer is formed over the doped isolation layer. See, for example, FIG. 23B. At 2626, an isolation filler structure is formed to fill a remainder of the deep trenches. See, for example, FIG. 23C. At 2630, color filters and micro-lenses are formed over the backside of the substrate. See, for example, FIGS. 23D-23E.

In some embodiments, the acts at 2624, 2626, and 2630 are performed, proceeding from 2618, to form an alternative embodiment of the IC in which the DTI structure comprises a light absorbing layer disposed along sidewalls of an isolation filler structure. At 2624, a planarization process is performed to align top surfaces of the doped isolation layer, the light absorbing layer, the diffusion enhancement layer, and the insulating layer. See, for example, FIG. 24A. At 2626, an isolation filler structure is formed to fill a remainder of the deep trenches. See, for example, FIG. 24B. At 2630, color filters and micro-lenses are formed over the backside of the substrate. See, for example, FIGS. 24C-24D.

In some embodiments, the acts at 2624, 2628, and 2630 are performed, proceeding from 2618, to form an alternative embodiment of the IC in which the DTI structure comprises a light absorbing layer entirely below an overlying isolation structure. At 2624, a planarization process is performed to align top surfaces of the doped isolation layer, the light absorbing layer, the diffusion enhancement layer, and the insulating layer. See, for example, FIG. 24A. At 2628, an overlying isolation structure is formed over the doped isolation layer. See, for example, FIG. 25B. At 2630, color filters and micro-lenses are formed over the backside of the substrate. See, for example, FIGS. 25C-25D.

While flowchart 2600 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Accordingly, in some embodiments, the present disclosure relates to a method for forming an integrated chip (IC), including forming a plurality of image sensing elements including a first doping type within a substrate, performing a first removal process to form deep trenches within the substrate, the deep trenches separating the plurality of image sensing elements from one another, performing an epitaxial growth process to form an isolation epitaxial precursor including a first material within the deep trenches and to form a light absorbing layer including a second material different than the first material within the deep trenches and between sidewalls of the isolation epitaxial precursor, performing a dopant activation process on the light absorbing layer and the isolation epitaxial precursor to form a doped isolation layer including a second doping type opposite the first doping type, and filling remaining portions of the deep trenches with an isolation filler structure. The doped isolation layer and the isolation filler structure form a deep trench isolation (DTI) structure to isolate image sensing elements from one another.

In other embodiments, the present disclosure relates to a method for forming an integrated chip (IC), including performing a doping process on a substrate to form a plurality of image sensing elements including a first doping type, performing a first removal process to form deep trenches within the substrate between adjacent image sensing elements of the plurality of image sensing elements, forming an isolation epitaxial precursor within the deep trenches, forming an insulating layer within the deep trenches and between sidewalls of isolation epitaxial precursor, forming a light absorbing layer within the deep trenches and between sidewalls of the isolation epitaxial precursor, performing a dopant activation process on the light absorbing layer and the isolation epitaxial precursor to heat the light absorbing layer and to form a doped isolation layer along sidewall surfaces of the deep trenches having a second doping type opposite the first doping type filling remaining portions of the deep trenches with an isolation filler structure. By heating the light absorbing layer, tensile stress is provided to the doped isolation layer and the substrate. The doped isolation layer and the isolation filler structure form a deep trench isolation (DTI) structure to isolate image sensing elements from one another.

In yet other embodiments, the present disclosure relates to an integrated chip (IC), including a substrate, a plurality of image sensing elements disposed in the substrate and including a first doping type, a deep trench isolation (DTI) structure separating adjacent image sensing elements of the plurality of image sensing elements from one another and including an isolation filler structure disposed between sidewalls of the substrate, a doped isolation layer disposed between the isolation filler structure and the substrate and including a second doping type opposite the first doping type, and a light absorbing layer including a first material disposed between the isolation filler structure and the doped isolation layer. The substrate is more heavily doped in a dopant diffusion region extending from the doped isolation layer into the substrate by a first distance. The first material has an absorption coefficient of greater than approximately $10^4$ centimeters$^{-1}$.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip (IC), comprising:
    forming a plurality of image sensing elements comprising a first doping type within a substrate;
    performing a first removal process to form deep trenches within the substrate, the deep trenches separating the plurality of image sensing elements from one another;
    performing an epitaxial growth process to form an isolation epitaxial precursor comprising a first material within the deep trenches and to form a light absorbing layer comprising a second material different than the first material within the deep trenches and between sidewalls of the isolation epitaxial precursor;
    performing a dopant activation process on the light absorbing layer and the isolation epitaxial precursor to form a doped isolation layer comprising a second doping type opposite the first doping type, wherein the dopant activation process comprises heating the light absorbing layer to a temperature of greater than approximately 900 degrees Celsius; and
    filling remaining portions of the deep trenches with an isolation filler structure, wherein the doped isolation layer and the isolation filler structure form a deep trench isolation (DTI) structure to isolate image sensing elements from one another.

2. The method of claim 1, further comprising:
    performing a second removal process to remove the light absorbing layer after performing the dopant activation process.

3. The method of claim 1, wherein during the dopant activation process, the light absorbing layer provides tensile stress to the doped isolation layer and the substrate.

4. The method of claim 1, wherein during the dopant activation process, dopants having the second doping type diffuse from the doped isolation layer into the substrate by a distance of more than approximately 5 nanometers.

5. The method of claim 1, wherein the dopant activation process comprises using a laser that correspondingly heats the light absorbing layer to the temperature of greater than approximately 900 degrees Celsius.

6. The method of claim 1, wherein the light absorbing layer comprises germanium, titanium nitride, aluminum oxide, or a silicon-germanium alloy.

7. The method of claim 1, wherein during the dopant activation process, light absorbing material diffuses from the light absorbing layer into the substrate by a distance of greater than approximately 1 nanometer.

8. The method of claim 1, further comprising:
    forming a high-k dielectric layer along sidewalls of the doped isolation layer.

9. A method for forming an integrated chip (IC), comprising:
    performing a doping process on a substrate to form a plurality of image sensing elements comprising a first doping type;
    performing a first removal process to form deep trenches within the substrate between adjacent image sensing elements of the plurality of image sensing elements;
    forming an isolation epitaxial precursor within the deep trenches;
    forming an insulating layer within the deep trenches and between sidewalls of isolation epitaxial precursor;
    forming a light absorbing layer within the deep trenches and between sidewalls of the isolation epitaxial precursor;
    performing a dopant activation process on the light absorbing layer and the isolation epitaxial precursor to heat the light absorbing layer and to form a doped isolation layer along sidewall surfaces of the deep trenches having a second doping type opposite the first doping type, wherein by heating the light absorbing layer, tensile stress is provided to the doped isolation layer and the substrate; and
    filling remaining portions of the deep trenches with an isolation filler structure, wherein the doped isolation layer and the isolation filler structure form a deep trench isolation (DTI) structure to isolate image sensing elements from one another.

10. The method of claim 9, further comprising:
    forming a high-k dielectric layer along sidewalls of the doped isolation layer.

11. The method of claim 9, further comprising:
    performing a second removal process to remove the light absorbing layer after performing the dopant activation process.

12. The method of claim 11, wherein the second removal process removes the insulating layer.

13. The method of claim 9, further comprising:
    forming a diffusion enhancement layer within the deep trenches and between sidewalls of the insulating layer, the diffusion enhancement layer having the second doping type.

14. The method of claim 9, wherein the insulating layer has a thickness of approximately 1 nanometer.

15. A method for forming an integrated chip (IC), comprising:
    forming a photodetector in a substrate;
    etching the substrate to form a trench in the substrate on opposite sides of the photodetector, wherein the trench is formed by sidewalls of the substrate;
    forming an isolation precursor layer in the trench along the sidewalls of the substrate, the isolation precursor layer comprising a first semiconductor material;
    forming a light absorbing layer in the trench and over of the isolation precursor layer, the light absorbing layer comprising a second semiconductor material, different than the first semiconductor material;
    providing optical radiation to the light absorbing layer to heat the light absorbing layer to form a doped isolation layer from the isolation precursor layer and to cause dopants from the doped isolation layer to diffuse into the substrate; and
    depositing an isolation filler layer in the trench and over the doped isolation layer, wherein the doped isolation layer and the isolation filler layer form a trench isolation structure in the trench.

16. The method of claim 15, further comprising:
    removing the light absorbing layer from over the trench after the optical radiation is provided to the light absorbing layer and before the isolation filler layer is deposited in the trench.

17. The method of claim 15, further comprising:
    forming an insulating layer in the trench and over the isolation precursor layer, wherein the light absorbing layer is formed over the insulating layer.

18. The method claim 17, further comprising:
    forming a diffusion enhancement layer in the trench and over the insulating layer, wherein the light absorbing layer is formed over the diffusion enhancement layer.

19. The method of claim 15, wherein the forming the photodetector in the substrate includes forming a doped region having a first doping type in the substrate, and wherein the doped isolation layer and the dopants have a second doping type, different than the first doping type.

20. The method of claim 15, wherein the optical radiation is provided to the light absorbing layer using a laser.

* * * * *